(12) United States Patent
Kang et al.

(10) Patent No.: US 7,851,835 B2
(45) Date of Patent: Dec. 14, 2010

(54) DISPLAY SUBSTRATE, METHOD OF MANUFACTURING THE SAME AND DISPLAY DEVICE HAVING THE SAME

(75) Inventors: Shin-Tack Kang, Yongin-si (KR); Dong-Hyeon Ki, Cheonan-si (KR); Sung-Man Kim, Seoul (KR); Sang-Hoon Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 258 days.

(21) Appl. No.: 11/494,257

(22) Filed: Jul. 27, 2006

(65) Prior Publication Data
US 2007/0045636 A1    Mar. 1, 2007

(30) Foreign Application Priority Data
Aug. 5, 2005    (KR) ...................... 10-2005-0071591

(51) Int. Cl.
*H01L 31/062* (2006.01)

(52) U.S. Cl. .................. 257/290; 257/411; 257/410; 257/223; 257/227; 257/291

(58) Field of Classification Search ................ 438/445, 438/444, 531, 551, 552, 555, 942; 257/411, 257/410, 223, 227, 291, 292, 439, 443, 655, 257/E27.1, E27.125, E27.112, E29.117, E29.145, 257/E29.147, E29.151, E29.182, E29.202, 257/E29.273–E29.299, E29.314, E29.32, 257/E23.016
See application file for complete search history.

(56) References Cited

U.S. PATENT DOCUMENTS

| | | | |
|---|---|---|---|
| 7,176,494 B2 * | 2/2007 | Kim | 257/72 |
| 7,190,000 B2 * | 3/2007 | Ryu et al. | 257/72 |
| 2003/0122983 A1 * | 7/2003 | Kim et al. | 349/43 |

* cited by examiner

*Primary Examiner*—N Drew Richards
*Assistant Examiner*—Yu-Hsi Sun
(74) *Attorney, Agent, or Firm*—Cantor Colburn LLP

(57) ABSTRACT

A display substrate includes a substrate, a first insulating layer, an undercut compensating member, a first electrode, a second insulating layer and a first conductive pattern. The first insulating layer is formed on the substrate. The undercut compensating member is formed on the first insulating layer. The undercut compensating member has an etching rate smaller than that of the first insulating layer. The first electrode is formed on a portion of the undercut compensating member. The second insulating layer is formed on the first insulating layer. The second insulating layer has a contact hole through which a portion of the first electrode and a remaining portion of the undercut compensating member. The first conductive pattern electrically connected to the first electrode through the contact hole.

19 Claims, 31 Drawing Sheets

DISPLAY SUBSTRATE, METHOD OF MANUFACTURING THE SAME AND DISPLAY DEVICE HAVING THE SAME

CROSS-REFERENCE TO RELATED APPLICATIONS

The present application claims priority to Korean Patent Application No. 2005-71591, filed on Aug. 5, 2005 and all the benefits accruing therefrom under 35 U.S.C. §119, the contents of which is hereby incorporated herein by reference in its entirety.

BACKGROUND OF THE INVENTION

1. Field of the Invention

The present invention relates to a display substrate, a method of manufacturing the display substrate and a display device having the display substrate. More particularly, the present invention relates to a display substrate capable of improving contact characteristics, a method of manufacturing the display substrate and a display device having the display substrate to improve an image display quality.

2. Description of the Related Art

A liquid crystal display (LCD) device, in general, displays images using optical and electrical characteristics of liquid crystals. The liquid crystals vary in arrangements in response to intensity of an electric field applied thereto, and a light transmittance of a liquid crystal layer having the liquid crystals is changed, thereby displaying images.

The array substrate is manufactured as a result of multiple processes such as a plurality of thin film deposition processes, a plurality of photo processes, a plurality of etching processes, etc.

In order to form a pattern on a plate, a metal layer or an insulating layer is deposited on the plate to form a thin film layer. That is, the thin film layer is the metal layer or the insulating layer. A photoresist film is formed on the thin film layer. An ultraviolet light is irradiated onto the photoresist film to expose the photoresist film. The exposed photoresist film is developed to form a photoresist pattern on the thin film layer. The thin film layer is partially etched using the photoresist pattern as an etching mask to form a pattern on the plate.

When the thin film layer is over-etched during the etching process, an undercut is formed in the thin film layer so that electrical contact characteristics of the array substrate are deteriorated, thereby decreasing a yield of the array substrate. In particular, the yield of the array substrate is decreased, as an integration of the array substrate is increased.

In addition, the number of masks for manufacturing the array substrate is increased so that a manufacturing cost of the array substrate is increased.

BRIEF SUMMARY OF THE INVENTION

One exemplary embodiment provides a display substrate capable of improving contact characteristics.

Another exemplary embodiment provides a method of manufacturing the above-mentioned display substrate.

Another exemplary embodiment provides a display device having the above-mentioned display substrate to improve an image display quality.

One exemplary embodiment of a display substrate includes a substrate, a first insulating layer, an undercut compensating member, a first electrode, a second insulating layer, and a first conductive pattern. The first insulating layer is formed on the substrate. The undercut compensating member is formed on the first insulating layer. The undercut compensating member has an etching rate smaller than that of the first insulating layer. The first electrode is formed on a portion of the undercut compensating member. The second insulating layer is formed on the first insulating layer. The second insulating layer has a contact hole through which a portion of the first electrode and a remaining portion of the undercut compensating member. The first conductive pattern electrically connected to the first electrode through the contact hole.

Another exemplary embodiment of a method of manufacturing a display substrate is provided as follows. A lower electrode is formed on a substrate. A first insulating layer is deposited on the substrate having the lower electrode. An undercut compensating member is formed on the first insulating layer. The undercut compensating member has an etching rate smaller than that of the first insulating layer. A first electrode is formed on a portion of the undercut compensating member. A second insulating layer is deposited on the first insulating layer having the first electrode. The second insulating layer is first etched to partially expose the first insulating layer corresponding to the lower electrode. The first and second insulating layers are second etched to form a first contact hole through which a portion of the first electrode and a remaining portion of the undercut compensating member adjacent to the first electrode are exposed, and a second contact hole through which the lower electrode is partially exposed. A first conductive pattern electrically connected to the first electrode through the first contact hole, and a second conductive pattern electrically connected to the lower electrode through the second contact hole are formed.

Another exemplary embodiment of a display device includes an array substrate, an opposite substrate and a liquid crystal layer. The array substrate includes a lower substrate, a gate electrode, a first insulating layer, a semiconductor layer pattern, an undercut compensating member, a first electrode, a second electrode, a second insulating layer and a pixel electrode. The gate electrode is formed on the lower substrate. The first insulating layer is formed on the lower substrate having the gate electrode. The semiconductor layer pattern is formed on the first insulating layer corresponding to the gate electrode. The undercut compensating member is formed on the first insulating layer. The undercut compensating member has an etching rate smaller than that of the first insulating layer. The first electrode is formed on the first insulating layer and a portion of the undercut compensating member. The second electrode is formed on the semiconductor pattern. The second electrode is spaced apart from the first electrode. The second insulating layer is formed on the first insulating layer. The second insulating layer has a contact hole through which a portion of the first electrode and a remaining portion of the undercut compensating member are exposed. The pixel electrode is electrically connected to the first electrode through the contact hole. The opposite substrate corresponds to the array substrate. The liquid crystal layer is interposed between the array substrate and the opposite substrate.

In exemplary embodiments, the array substrate can be used for a liquid crystal display (LCD) device, an organic light emitting display (OLED) device, a plasma display panel (PDP) device, etc.

In another exemplary embodiment, the undercut compensating portion is formed on the gate insulating layer, and the contact hole of the passivation layer is formed on the conductive pattern that is formed on the gate insulating layer and the undercut compensating portion to improve the contact characteristics of the contact hole. In addition, the undercut compensating portion may be formed in the gate insulating layer.

In another exemplary embodiment, a plurality of contact holes is formed through a plurality of etching processes to decrease the undercut in the contact holes. The contact holes are formed using one mask to decrease a cost of manufacturing the display substrate.

In another exemplary embodiment, the mask for forming the contact holes includes the slits aligned in substantially parallel with each other so that the passivation layer and/or the gate insulating layer is uniformly etched.

BRIEF DESCRIPTION OF THE DRAWINGS

The above and other advantages of the present invention will become more apparent by describing in detail example embodiments thereof with reference to the accompanying drawings, in which.

DETAILED DESCRIPTION OF THE INVENTION

Figure 1:
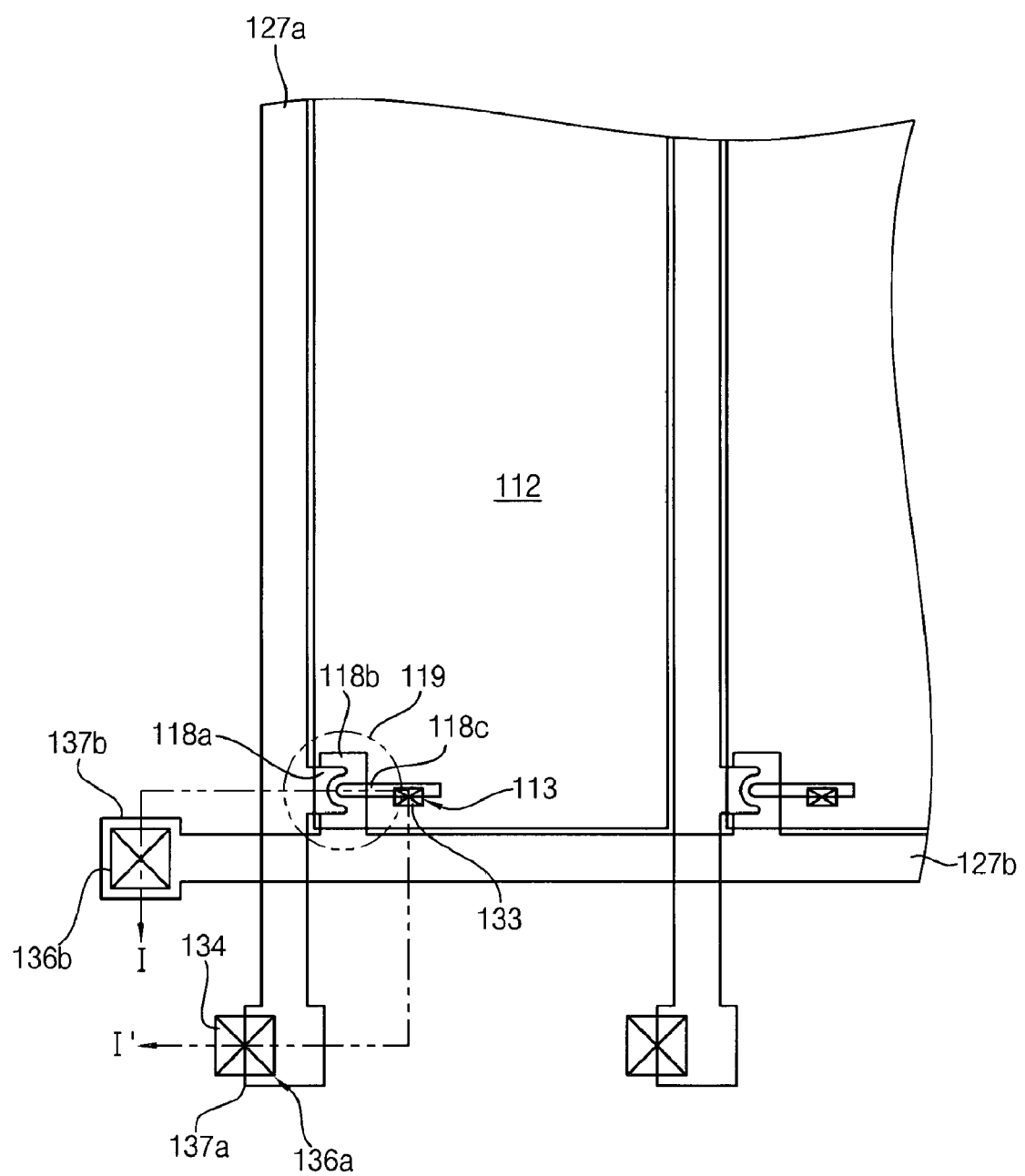
FIG. 1 is a plan view showing an exemplary embodiment of a display substrate in accordance with the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on" or "connected to" another element or layer, it can be directly on or connected to the other element or layer or intervening elements or layers may be present. In contrast, when an element is referred to as being "directly on" or "directly connected to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "lower," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "lower" relative to other elements or features would then be oriented "upper" relative to the other elements or features. Thus, the exemplary term "lower" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be described in detail with reference to the accompanying drawings.

FIG. 1 is a plan view showing an exemplary embodiment of a display substrate in accordance with the present invention.

Figure 2:
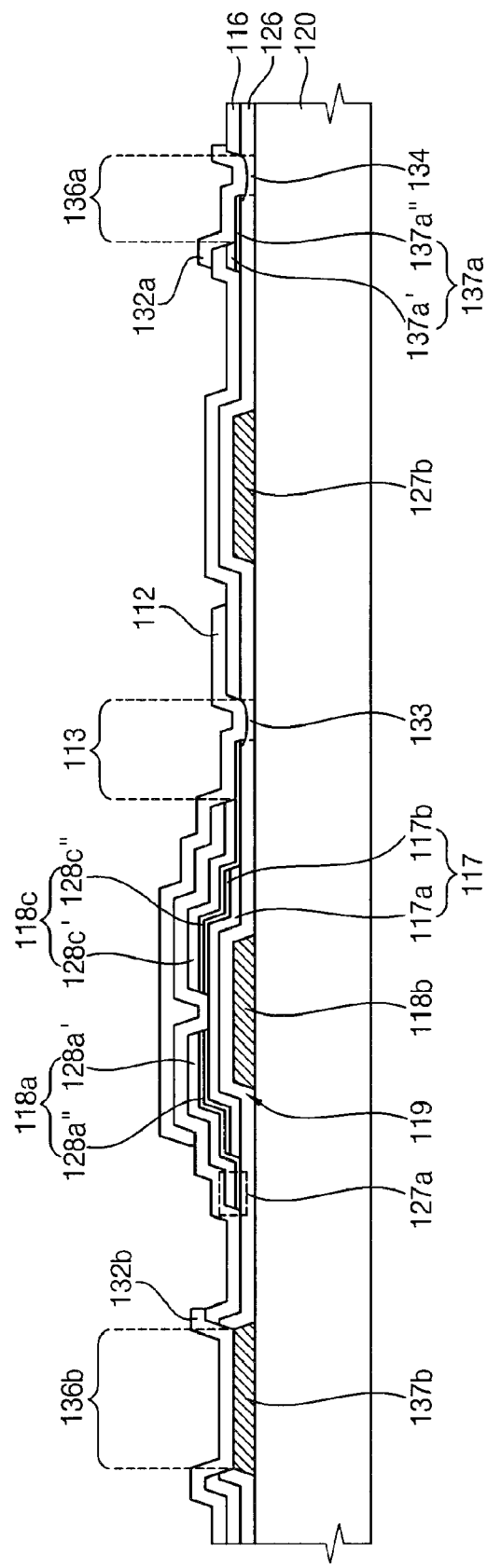
FIG. 2 is a cross-sectional view taken along line I-I' shown in FIG. 1.

FIG. 2 is a cross-sectional view taken along line I-I' shown in FIG. 1. In FIGS. 1 and 2, the display substrate is an array substrate for a display device.

Referring to FIGS. 1 and 2, the array substrate 180 includes a lower substrate 120, a thin film transistor 119, a data line 127a, a data pad 137a, a gate line 127b, a gate pad 137b, a storage capacitor (not shown), a gate insulating layer 126, a semiconductor layer pattern 117, a pixel electrode 112, a first signal transmitting pattern 132a and a second signal transmitting pattern 132b. In exemplary embodiments, the array substrate 180 may further include a plurality of thin film transistors 119, a plurality of data lines 127a, a plurality of data pads 137a, a plurality of gate lines 127b, a plurality of gate pads 137b, a plurality of storage capacitors, a plurality of semiconductor layer patterns 117, a plurality of pixel electrodes 112, a plurality of first signal transmitting patterns 132a and a plurality of second signal transmitting patterns 132b. The data and gate lines 127a and 127b define a pixel.

The lower substrate 120 may include a transparent material, such as transparent glass, a transparent quartz, etc. Light may pass through the lower substrate 120. In one exemplary embodiment, the lower substrate 120 does not include alkaline ions. When the lower substrate 120 includes the alkaline ions, the alkaline ions may be dissolved in a liquid crystal layer (not shown) to decrease a resistivity of the liquid crystal layer (not shown), thereby decreasing image display quality and an adhesive strength between a sealant (not shown) and the lower substrate 120. In addition, characteristics of the thin film transistor 119 may be deteriorated when the lower substrate 120 includes the alkaline ions.

In an alternative exemplary embodiment, the lower substrate 120 may also include a high polymer that may be optically transparent. The optically transparent high polymer that can be used for the lower substrate 120 includes, but is not limited to, triacetylcellulose (TAC), polycarbonate (PC), polyethersulfone (PES), polyethyleneterephthalate (PET), polyethylenenaphthalate (PEN), polyvinylalcohol (PVA), polymethylmethacrylate (PMMA), cyclo-olefin polymer (COP) and any material suitable for the purpose described herein. These materials for the lower substrate may be used alone or in a combination thereof.

In another exemplary embodiment, the lower substrate 120 may be optically isotropic. In an alternative exemplary embodiment, the lower substrate 120 may be optically anisotropic.

The thin film transistor 119 is formed on the lower substrate 120 and includes a source electrode 118a, a gate electrode 118b, a drain electrode 118c and the semiconductor layer pattern 117.

The gate electrode 118b is formed on the lower substrate 120 and is electrically connected to the gate line 127a. The gate line 127a is formed on the lower substrate 120. The gate pad 137b is formed on the lower substrate 120 and is electrically connected to the gate line 127a. Alternative embodiments include configurations where an end portion of the gate line 127a may function as the gate pad 137b.

The gate insulating layer 126 is formed on the lower substrate 120 (having the gate electrode 118b, the gate line 127b and the gate pad 137b) such that the gate electrode 118b, the gate line 127b and the gate pad 137b are electrically insulated from the source electrode 118a, the drain electrode 118c, the semiconductor layer pattern 117, the data line 127a and the data pad 137a. The gate insulating layer 126 may include an insulating material. The insulating material that can be used for the gate insulating layer 126 may include, but is not limited to, silicon nitride and silicon oxide. These can be used alone or in a combination thereof.

The gate insulating layer 126 includes a third contact hole 136b, a first undercut compensating portion 133 and a second undercut compensating portion 134. The gate pad 137b is partially exposed through the third contact hole 136b. The first undercut compensating portion 133 is exposed through a first contact hole 113 of a passivation layer 116. The second undercut compensating portion 134 is exposed through a second contact hole 136a of the passivation layer 116. In FIGS. 1 and 2, an entirety of the first and second undercut compensating portions 133 and 134 is exposed through each of the first and second contact holes 113 and 136a of the passivation layer 116.

Each of the first and second undercut compensating portions 133 and 134 has a thickness in a direction substantially perpendicular to the lower substrate 120 that is thinner than that of a remaining portion of the gate insulating layer 126. That is, a portion of the insulating material that forms the gate insulating layer 126 remains to form the first and second undercut compensating portions 133 and 134.

In alternative exemplary embodiments, when each of the first and second undercut compensating portions 133 and 134 is not formed on the lower substrate 120, a portion of the lower substrate 120 may be exposed through each of the first and second contact holes 113 and 136a such that an undercut is formed under each of the drain electrode 118c and the data pad 137a. When the undercut is formed under each of the drain electrode 118c and the data pad 137a, the drain electrode 118c and the data pad 137a may be electrically disconnected from the pixel electrode 112 and the first signal transmitting pattern 132a, respectively. In FIGS. 1 and 2, the first and second undercut compensating portions 133 and 134 prevent the undercut thereby improving electrical characteristics between the drain electrode 118c and the pixel electrode 112 and between the data pad 137a and the first signal transmitting pattern 132a.

The semiconductor layer pattern 117 is formed on the gate insulating layer 126 corresponding (in location, size and/or shape) to the gate electrode 118b. The semiconductor layer pattern 117 includes an amorphous silicon pattern 117a and an N+ amorphous silicon pattern 117b. The amorphous silicon pattern 117a is formed on the gate insulating layer 126. The N+ amorphous silicon pattern 117b is formed on the amorphous silicon pattern 117a. The N+ amorphous silicon pattern 117b includes two N+ amorphous silicon portions that are spaced apart from each other and correspond to the source and drain electrodes 118a and 118c, respectively.

The source electrode 118a is formed on the gate insulating layer 126 (having the semiconductor layer pattern 117) to be electrically connected to the data line 127a. In FIGS. 1 and 2, the source electrode 118a includes a first source metal pattern 128a" and a second source metal pattern 128a'. The first source metal pattern 128a" is formed on the semiconductor layer pattern 117. The second source metal pattern 128a' is formed on the first source metal pattern 128a'. The first source metal pattern 128a" includes a first metal. The first metal that can be used for the first source metal pattern 128a" includes, but is not limited to, chromium, molybdenum and neodymium. These materials may be used alone or in a combination thereof.

The second source metal pattern 128a' includes a second metal. The second metal that can be used for the second source metal pattern 128a' includes, but is not limited to, aluminum and copper. These materials may be used alone or in a combination thereof. In one exemplary embodiment, the first and second source metal patterns 128a" and 128a' include chromium and aluminum, respectively. In an alternative exemplary embodiment, the source electrode 118a may have a single layered structure or a multi layered structure, such as having more than three layers.

The drain electrode 118c is formed on the gate insulating layer 126 (having the semiconductor layer pattern 117) to be electrically connected to the pixel electrode 112 through the first contact hole 113. In FIGS. 1 and 2, the drain electrode 118c includes a first drain metal pattern 128c" and a second drain metal pattern 128c'. The first drain metal pattern 128c" is formed on the semiconductor layer pattern 117. The second drain metal pattern 128c' is formed on the first drain metal pattern 128c'. Each of the first and second drain metal patterns 128c" and 128c' may include a material substantially the same as that of the first and second source metal patterns 128a" and 128a' as described above. In one exemplary embodiment, the first drain metal pattern 128c" may have a size greater than that of the second drain metal pattern 128c' such that a portion of the first drain metal pattern 128c" is exposed through the first contact hole 113. That is, the second drain metal pattern 128c' in the first contact hole 113 is partially removed so that the first drain metal pattern 128c" has the size greater than (or extends further than) that of the second drain metal pattern 128c'.

The data pad 137a is formed on the gate insulating layer 126 to be electrically connected to the first signal transmitting pattern 132a through the second contact hole 136a. In FIGS. 1 and 2, the data pad 137a includes a first data pad metal pattern 137a" and a second data pad metal pattern 137a'. The first data pad metal pattern 137a" is formed on the gate insulating layer 126. The second data pad metal pattern 137a' is formed on the first data pad metal pattern 137a'. Each of the first and second data pad metal patterns 137a" and 137a' may include a material substantially the same as each of the first and second source metal patterns 128a" and 128a' as described above. In one exemplary embodiment, the first data pad metal pattern 137c" may have a size greater than that of the second data pad metal pattern 137c' such that a portion of the first data pad metal pattern 137c" is exposed through the second contact hole 136a. The second data pad metal pattern 137c' in the second contact hole 136a may be partially removed so that the first data pad metal pattern 137c" may have the size greater than that of the second data pad metal pattern 137c'.

When a gate signal is applied to the gate electrode 118b, a channel is formed in the amorphous silicon pattern 117a between the source and drain electrodes 118a and 118c such that a data voltage applied to the source electrode 118a is transferred to the drain electrode 118c through the channel.

The passivation layer 116 is formed on the gate insulating layer 126 having the thin film transistor 119, the gate line 127b, the gate pad 137b, the data line 127a and the data pad 137a. The passivation layer 116 has the first contact hole 113, the second contact hole 136a and the third contact hole 136b. A portion of the first drain metal pattern 128c" of the drain electrode 118c and the first undercut compensating portion 133 are exposed through the first contact hole 113. A portion of the first data pad metal pattern 137a" of the data pad 137a and the second undercut compensating portion 134 are exposed through the second contact hole 136a. The third contact hole 136b is formed through the gate insulating layer 126 and the passivation layer 116, and the gate pad 137b is partially exposed through the third contact hole 136b.

The passivation layer 116 may include an insulating material. The insulating material that can be used form the passivation layer 116 may include, but is not limited to, silicon nitride silicon oxide. These insulating materials may be used alone or in a combination thereof. Alternatively, the passivation layer 116 may include a transparent organic material.

The pixel electrode 112 is formed on the passivation layer 116 (having the first contact hole 113) corresponding to the pixel to be electrically connected to the drain electrode 118c through the first contact hole 113. The pixel electrode 112 may include a transparent conductive material. The transparent conductive material that can be used for the pixel electrode 112 may include, but is not limited to, indium tin oxide (ITO), tin oxide (TO), indium zinc oxide (IZO), zinc oxide (ZO), indium tin zinc oxide (ITZO), amorphous indium tin oxide (a-ITO) as well as any combination including one of the foregoing. These materials can be used alone or in a combination thereof. Alternative embodiments may include configurations where the pixel electrode 112 may further include a reflection electrode having a highly reflective material.

In an exemplary embodiment, the storage capacitor (not shown) maintains a voltage difference between the pixel electrode 112 and a common electrode (not shown) of a color filter substrate (not shown) corresponding to the display substrate for one frame. In FIGS. 1 and 2, the pixel electrode 112 is partially overlapped with the gate line 127b to form the storage capacitor (not shown). The array substrate 180 may further include a storage capacitor line (not shown).

In another exemplary embodiment, an alignment layer (not shown) may be formed on the array substrate 180 to align liquid crystals of the liquid crystal layer (not shown).

In another exemplary embodiment, the array substrate 180 may further include a gate driving part (not shown), a data driving part (not shown) and a data signal selecting part (not shown). The gate driving part (not shown), the data driving part (not shown) and the data signal selecting part (not shown) may be directly formed on the array substrate 180. The gate driving part (not shown) applies a gate signal to the gate electrode 118b through the second signal transmitting pattern 132b, the gate pad 137b and the gate line 127b. The data driving part (not shown) applies a data signal to the source electrode 118a through the first signal transmitting pattern 132a, the data pad 137a and the data line 127a. In an alternative exemplary embodiment, the data signal selecting part (not shown) may be interposed between the data driving part (not shown) and a plurality of the first signal transmitting patterns dividing the data signal into a plurality of data voltages, and may apply the data voltages to the first signal transmitting patterns.

Referring again to FIGS. 1 and 2, the gate insulating layer 126 includes the first and second undercut compensating portions 133 and 134 The first contact hole 113 is formed on the drain electrode 118c and the first contact hole compensating part 133 to improve the contact characteristics of the first contact hole 113. In addition, the second contact hole 136a is formed on the data pad 137a and the second contact hole compensating part 134 to improve the contact characteristics of the second contact hole 136a.

FIGS. 3 to 7 and 11 to 17 are cross-sectional views showing an exemplary embodiment of a method of manufacturing the display substrate shown in FIG. 1.

Figure 3:
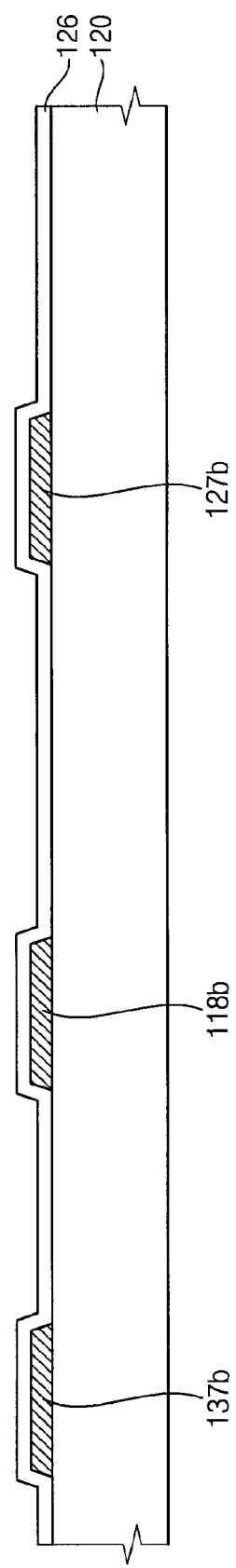
FIGS. 3 to 7 and 11 to 17 are cross-sectional views showing an exemplary embodiment of a method of manufacturing the display substrate shown in FIG. 1.

Referring to FIG. 3, a conductive layer (not shown) is deposited on the lower substrate 120. The conductive material that can be used for the conductive layer (not shown) may include, but is not limited to, molybdenum, chromium and copper. These materials can be used alone or in a combination thereof. The conductive layer (not shown) is partially etched to form the gate electrode 118b, the gate line 127b and the gate pad 137b. In FIG. 3, the conductive layer (not shown) may be partially etched through a photolithography process using a first mask (not shown). The gate insulating layer 126 is deposited on the lower substrate 120 having the gate electrode 118b, the gate line 127b and the gate pad 137b.

Figure 4:
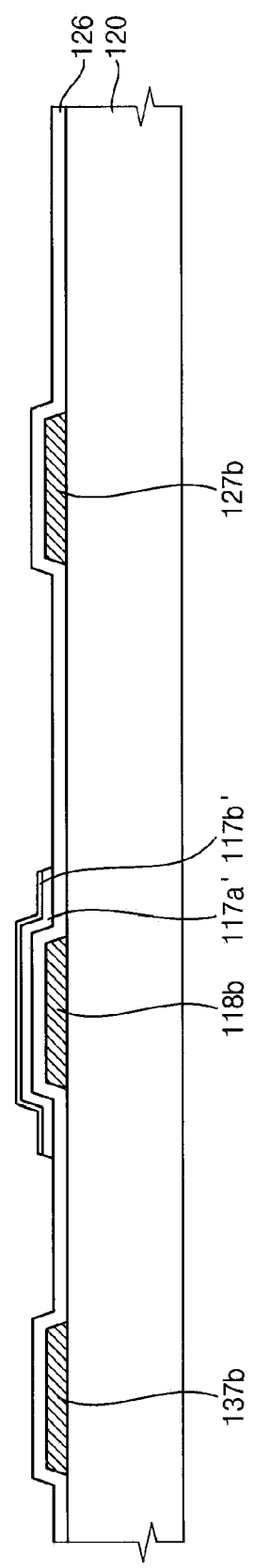

Referring to FIG. 4, a base amorphous silicon layer (not shown) is deposited on the gate insulating layer 126. N+ ions are implanted on an upper portion of the base amorphous silicon layer (not shown) to form an amorphous silicon layer (not shown) on the gate insulating layer 126 and an N+ amorphous silicon layer (not shown) on the amorphous silicon layer (not shown). The amorphous silicon layer (not shown) and the N+ amorphous silicon layer (not shown) are partially etched to form a primary amorphous silicon layer 117a' and a primary N+ amorphous silicon layer 117b'. The primary amorphous silicon layer 117a' and the primary N+ amorphous silicon layer 117b' are partially etched through a photolithography process using a second mask (not shown). The primary amorphous silicon layer 117a' and the primary N+ amorphous silicon layer 117b' correspond to the gate electrode 118b.

Figure 5:
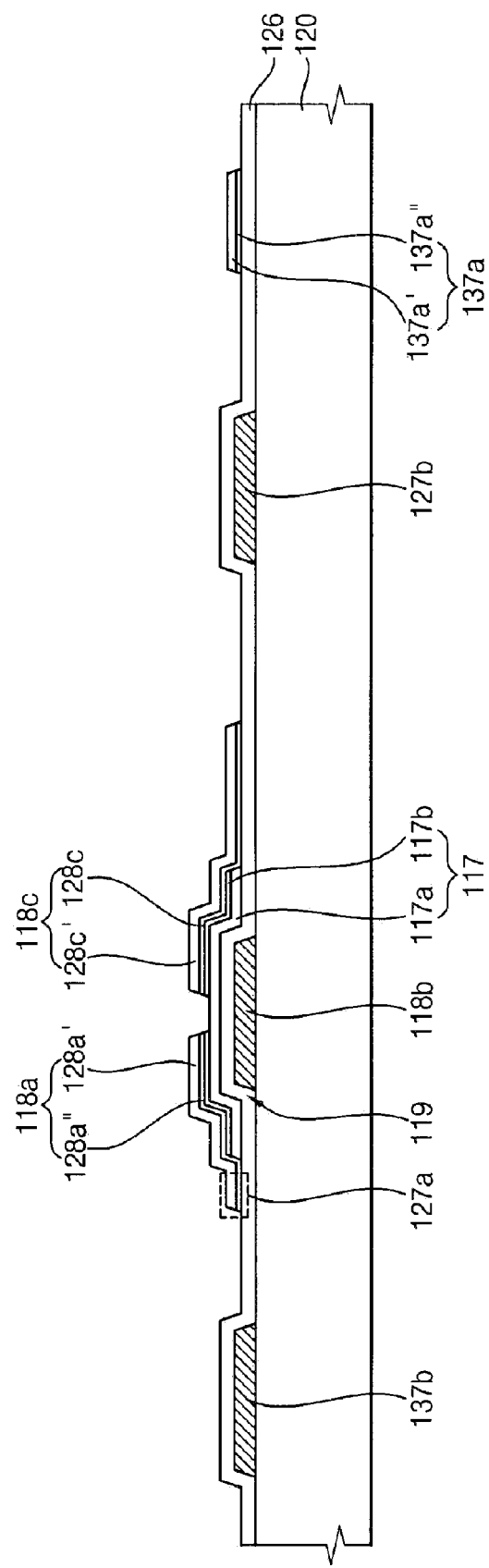

Referring to FIG. 5, a first metal layer (not shown) is deposited on the gate insulating layer 126 having the primary amorphous silicon layer 117a' and the primary N+ amorphous silicon layer 117b'.

A second metal layer (not shown) is deposited on the first metal layer (not shown). The first metal layer (not shown) may include chromium and the second metal layer (not shown) may include aluminum.

The first and second metal layers (not shown) are partially etched to form the source electrode 118a, the drain electrode 118c, the data line 127a and the data pad 137a.

The first source metal pattern 128a" of source electrode 118a, the first drain metal pattern 128c" of the drain electrode 118c, the first data line metal pattern of the data line 127a and the first data metal pattern 137a" of the data pad 137a are formed from the first metal layer (not shown). In addition, the second source metal pattern 128a' of the source electrode 118a, the second drain metal pattern 128c' of the drain electrode 118c, the second data line metal pattern of the data line 127a and the second data metal pattern 137a' of the data pad 137a are formed from the second metal layer (not shown).

In FIG. 5, the first and second metal layers (not shown) are partially etched through a photolithography process using a third mask (not shown). A portion of the primary N+ amorphous silicon layer 117b' interposed between the source and drain electrodes 118a and 118c is removed through an etching process using the source and drain electrodes 118a and 118c as an etching mask to form the semiconductor layer pattern 117 having the amorphous silicon layer 117a and the N+ amorphous silicon layer 117b.

Figure 6:
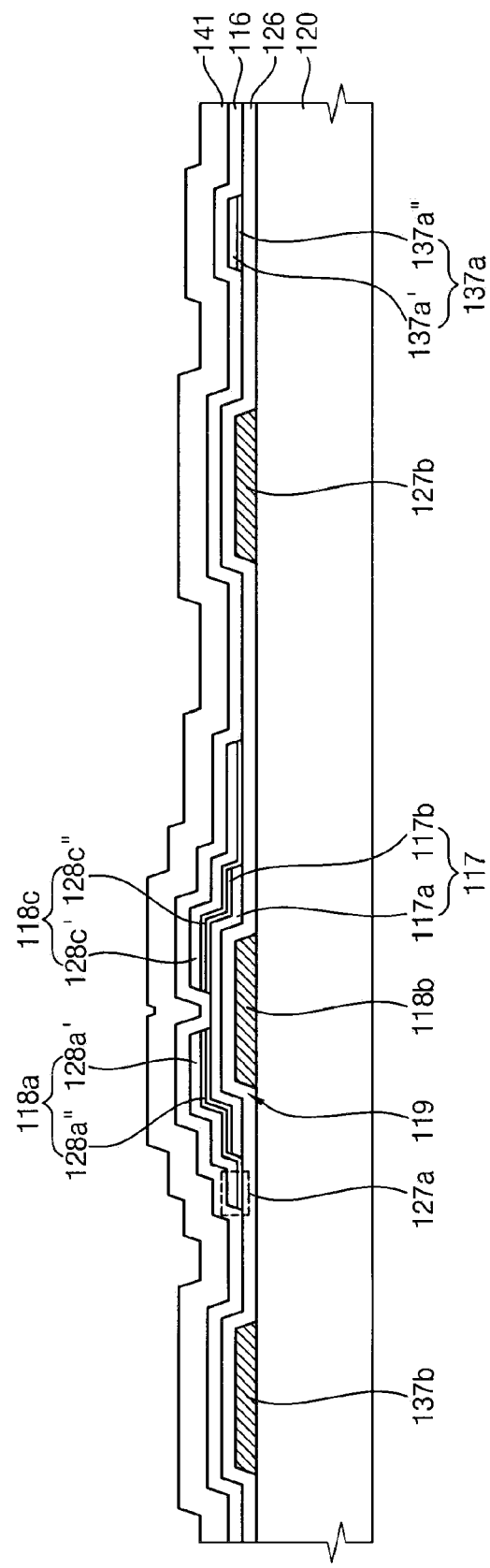

Referring to FIG. 6, the passivation layer 116 is formed on the gate insulating layer 126 having the semiconductor layer pattern 117, the source electrode 118a, the drain electrode 118c, the data line 127a and the data pad 137a. The passivation layer 116 may be formed through a deposition process. The gate pad 137b and the gate line 127b are disposed under the gate insulating layer 126 and the passivation layer 116. The source electrode 118a, the drain electrode 118c, the data line 127a and the data pad 137a are positioned between the gate insulating layer 126 and the passivation layer 116. A photoresist film 141 is formed on the passivation layer 116. In one exemplary embodiment, the photoresist film 141 may be coated on the passivation layer 116.

Figure 7:
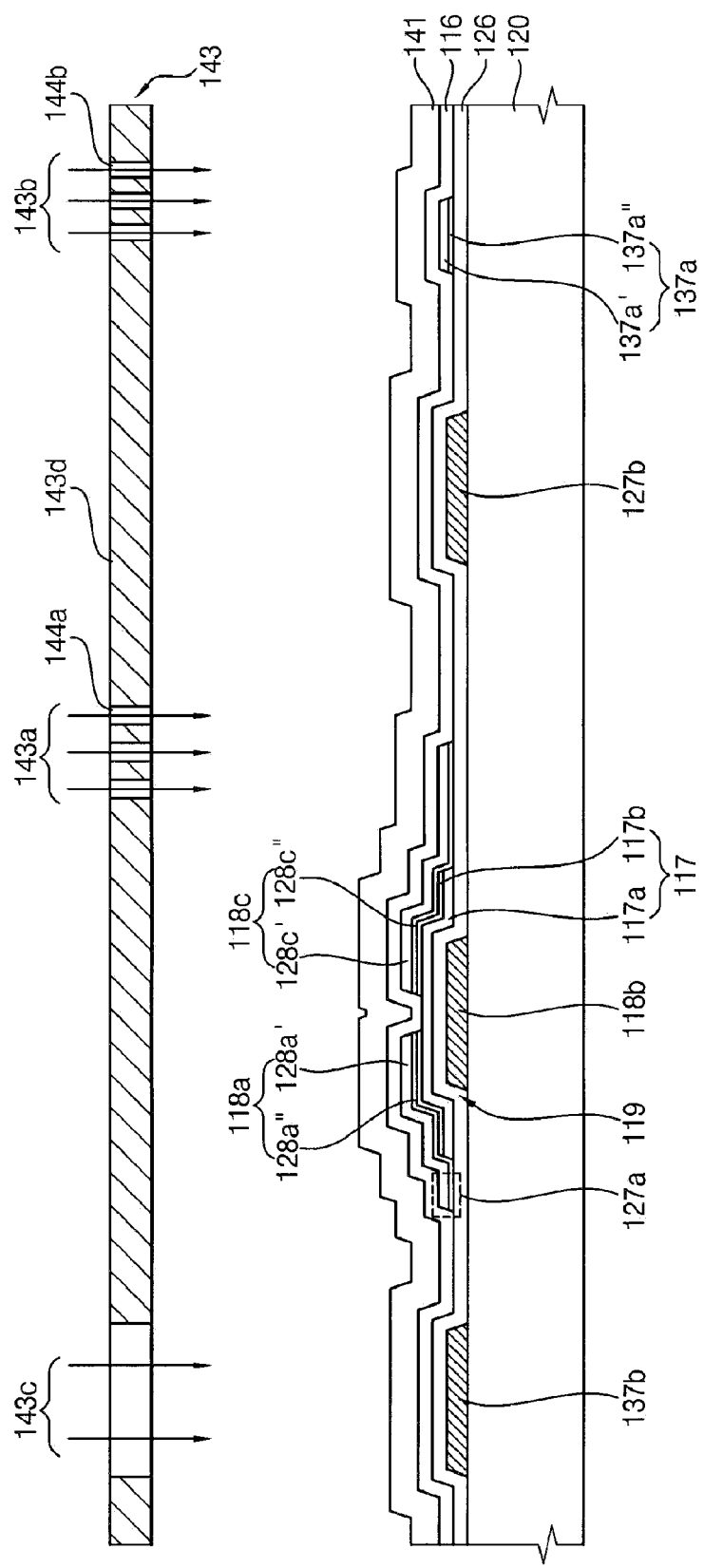
Figure 8:
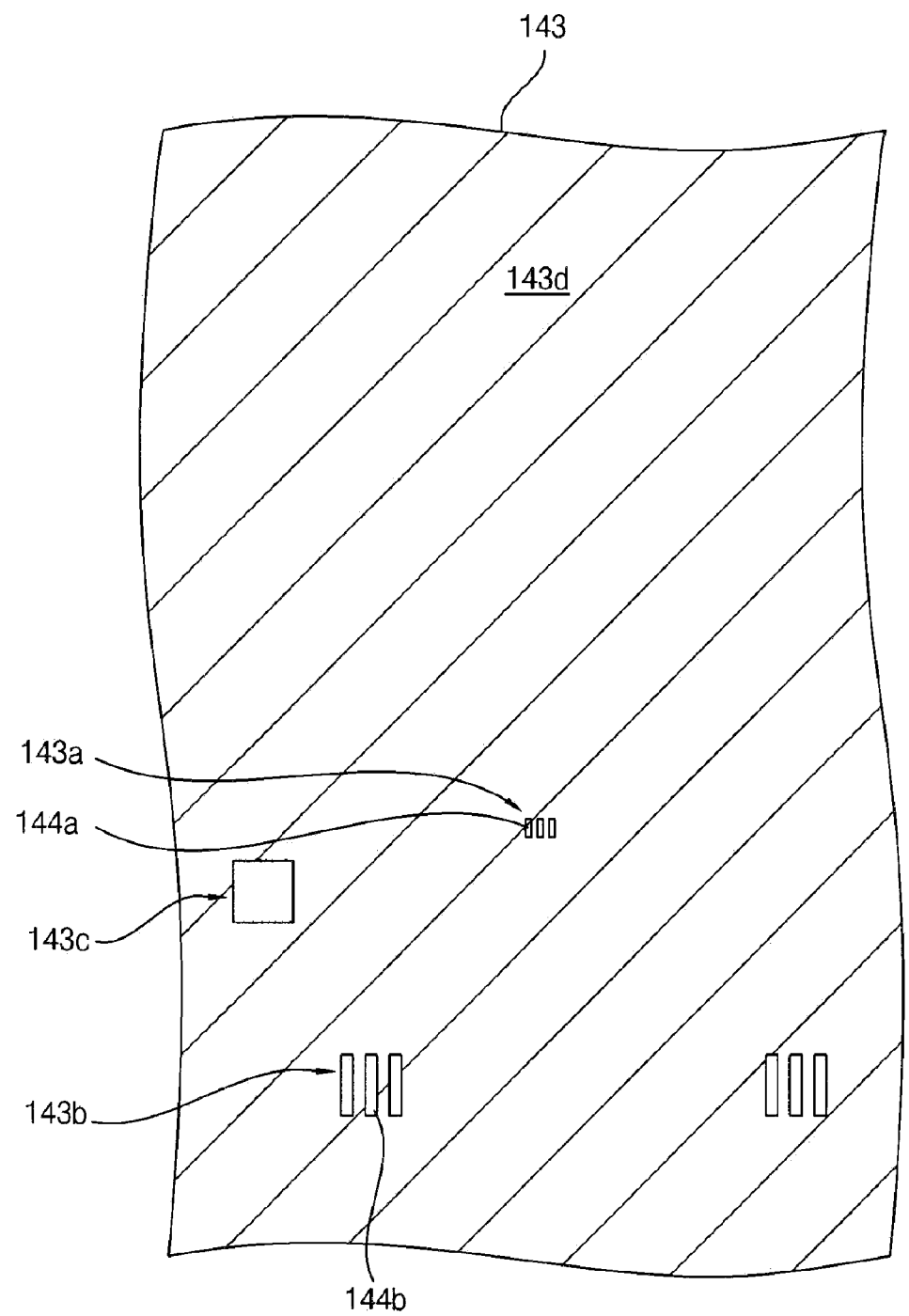
FIG. 8 is a plan view showing an exemplary embodiment of a fourth mask shown in FIG. 7.

FIG. 8 is a plan view showing a fourth mask shown in FIG. 7.

Referring to FIGS. 7 and 8, the photoresist film 141 is exposed through a fourth mask 143. The fourth mask 143 includes a first translucent portion 143a, a second translucent portion 143b, a transparent portion 143c and an opaque portion 143d.

The first translucent portion 143a corresponds to the first contact hole 113 (shown in FIG. 2). That is, the first translucent portion 143a corresponds to an end portion of the drain electrode 118c and a portion of the gate insulating layer 126 adjacent to the end portion of the drain electrode 118c.

The second translucent portion 143b corresponds to the second contact hole 136a (shown in FIG. 2). That is, the second translucent portion 143b corresponds to an end portion of the data pad 137a and a portion of the gate insulating layer 126 adjacent to the end portion of the data pad 137a.

The first translucent portion 143a includes a plurality of first slits 144a arranged substantially in parallel with each other. The second translucent portion 143b includes a plurality of second slits 144b arranged in substantially parallel with each other. In FIGS. 7 and 8, the first and second slits 144a and 144b are substantially in parallel with the data line 127a.

The photoresist film 141 is exposed through the fourth mask 143, such as through a line scanning method. In the line scanning method, light irradiated onto the fourth mask 143 has a substantially linear shape. When the first slits are arranged in different direction from the second slits, the light having passed through the first slits may have different intensity from the light having passed through the second slits so that the passivation layer 116 and the gate insulating layer may not be uniformly etched. As in the illustrated exemplary embodiment, the first slits 144a are arranged in a direction substantially the same as that of the second slits 144b The light having passed through the first slits 144a may have an intensity substantially the same as that of the light having passed through the second slits 144b so that the passivation layer 116 and the gate insulating layer 126 may be uniformly etched. Alternative embodiments include configurations where each of the first and second translucent portions 143a and 143b may have a translucent material. In FIGS. 7 and 8, the first and second translucent portions 143a and 143b correspond to the first and second contact holes 113 and 136a through which the conductive patterns are formed interposed between the gate insulating layer 126 and the passivation layer 116, respectively.

The transparent portion 143c corresponds to the gate pad 137b. Light having passed through the transparent portion 143c has an intensity relatively greater than that of the light having passed through the first and second translucent portions 143a and 143b.

The opaque portion 143d is interposed among the first translucent portion 143a, the second translucent portions 143b and the transparent portion 143c.

Figure 9:
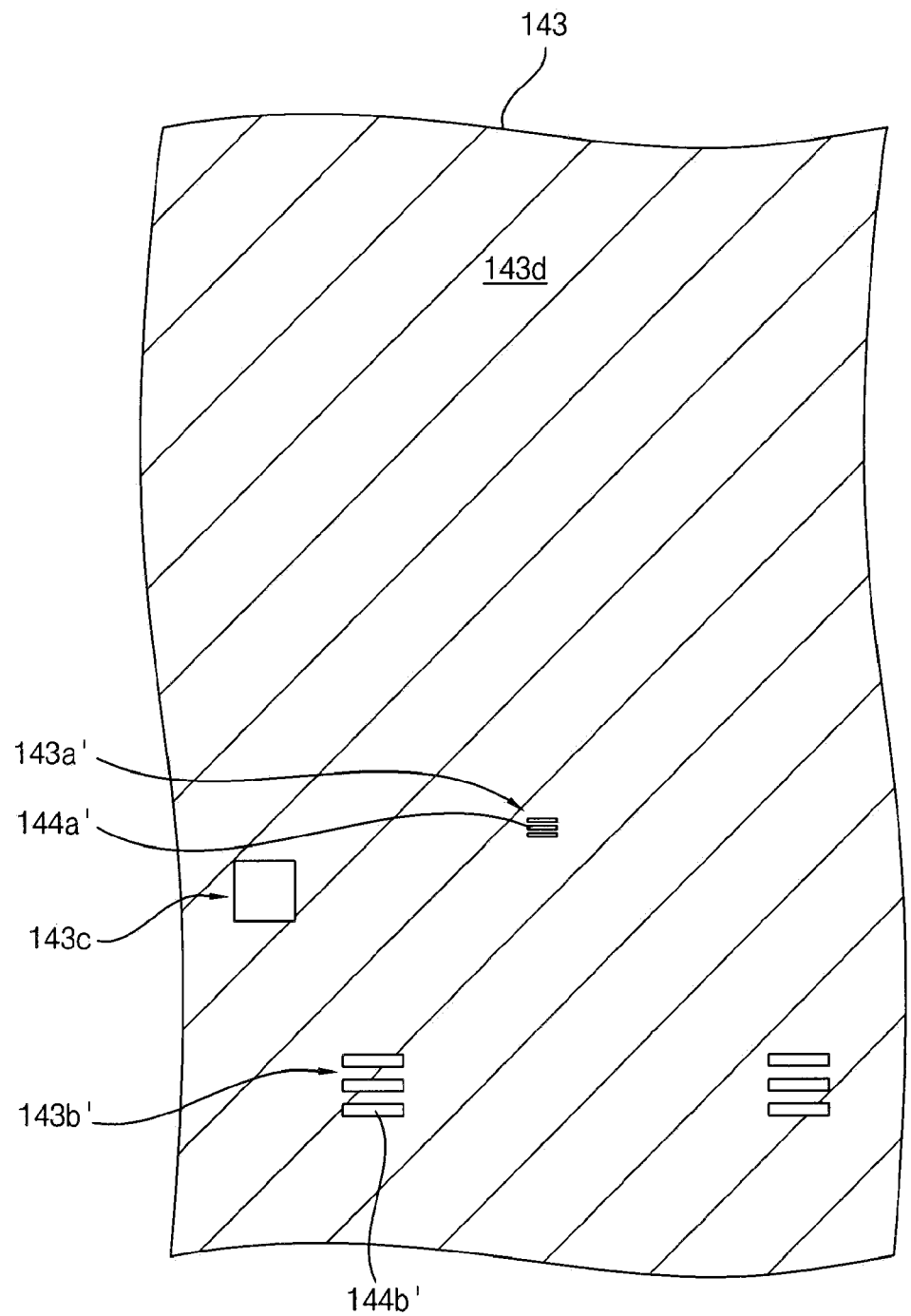
FIG. 9 is a plan view showing another exemplary embodiment of a fourth mask in accordance with the present invention.

FIG. 9 is a plan view showing another exemplary embodiment of a fourth mask in accordance with the present invention.

Referring to FIG. 9, the fourth mask 143 includes a first translucent portion 143a', a second translucent portion 143b', a transparent portion 143c and an opaque portion 143d. The first and second translucent portions 143a' and 143b' include a plurality of first slits 144a' and a plurality of second slits 144b'. The first and second slits 144a' and 144b' are substantially in parallel with a gate line 127b (shown in FIG. 1).

Figure 10:
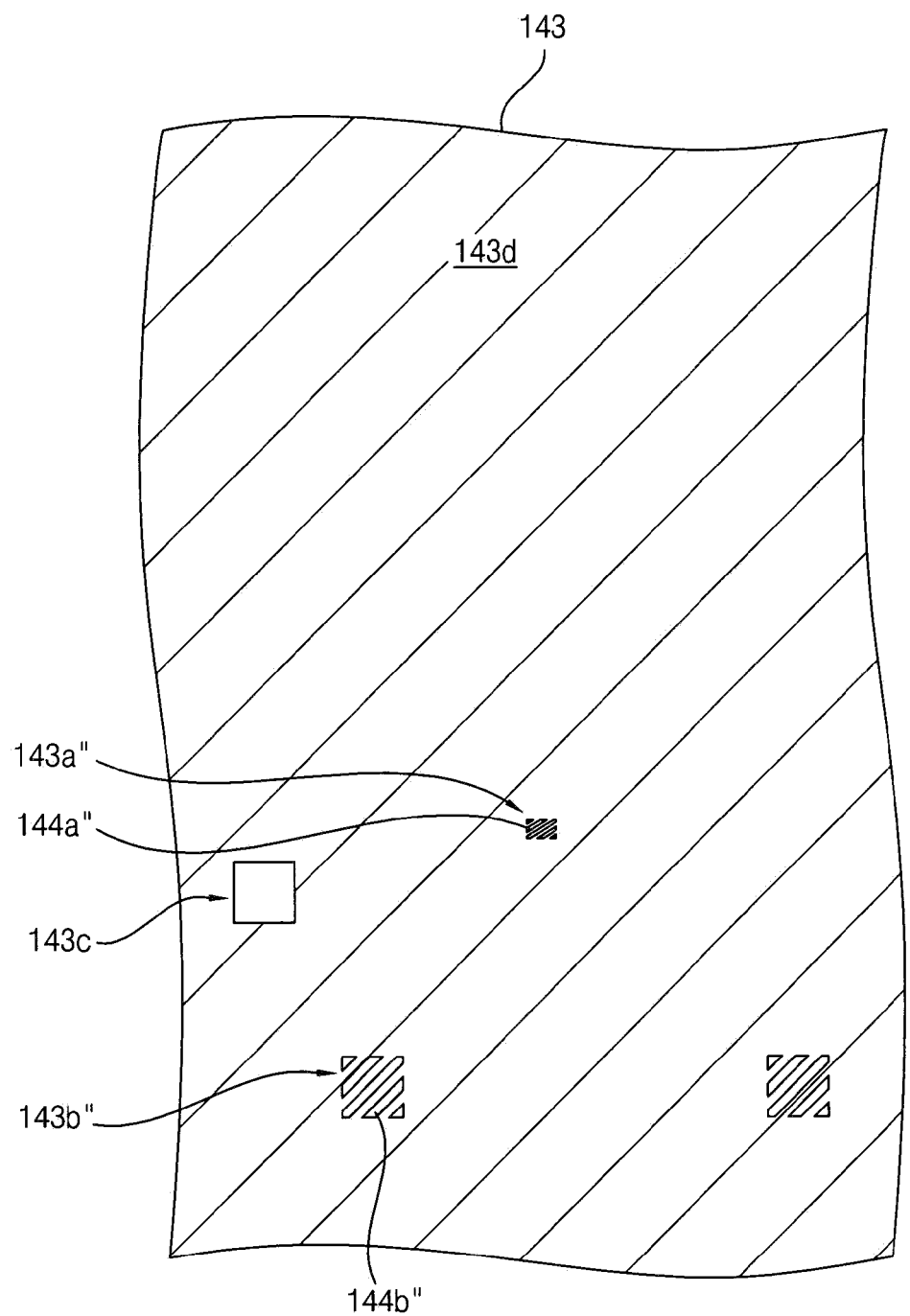
FIG. 10 is a plan view showing another exemplary embodiment of a fourth mask in accordance with the present invention.

FIG. 10 is a plan view showing another exemplary embodiment of a fourth mask in accordance with the present invention.

Referring to FIG. 10, the fourth mask 143 includes a first translucent portion 143a", a second translucent portion 143b", a transparent portion 143c and an opaque portion 143d. The first and second translucent portions 143a" and 143b" include a plurality of first slits 144a" and a plurality of second slits 144b". The first and second slits 144a" and 144b"

are substantially in parallel with a diagonal direction of a pixel electrode 112 (shown in FIG. 1).

Figure 11:
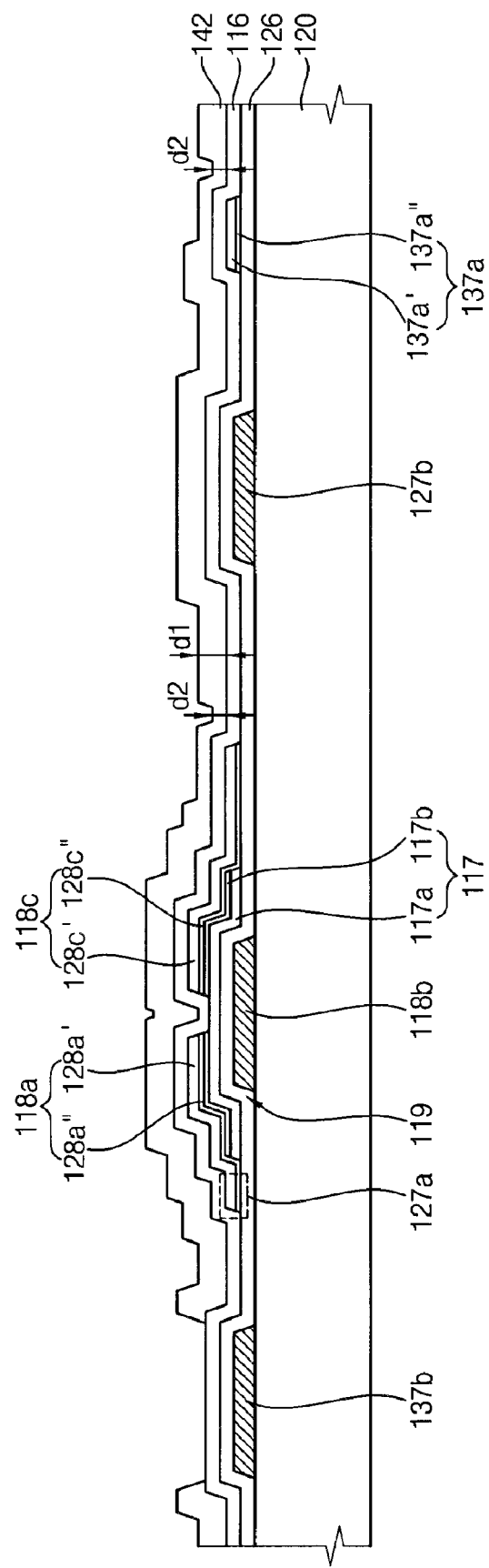

Referring to FIG. 11, the exposed photoresist film 141 (shown in FIG. 7) is developed. The developed photoresist film 142 has various thicknesses. A thickness d2 of the developed photoresist film 142 corresponding to the first and second translucent portions 143a and 143b (shown in FIG. 8) is smaller than a thickness d1 of the developed photoresist film 142 corresponding to the opaque portion 143d (shown in FIG. 8). A portion of the developed photoresist film 142 corresponding to the transparent portion 143c (shown in FIG. 8) is removed so that the passivation layer 116 is partially exposed.

Figure 12:
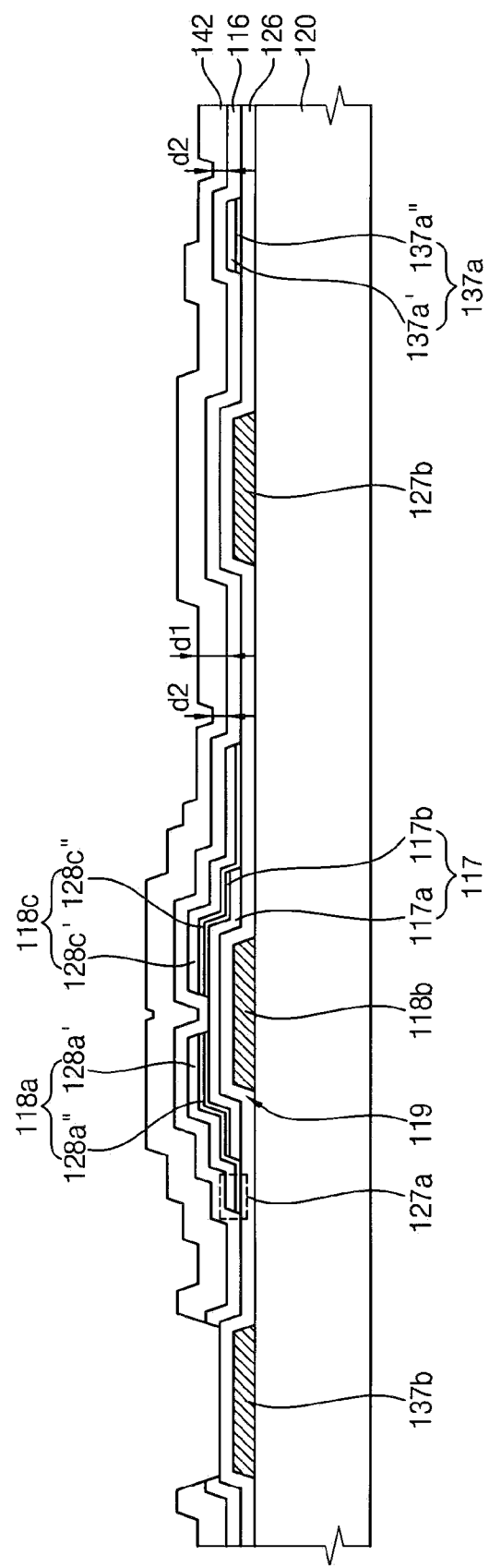

Referring to FIG. 12, the passivation layer 116 is first etched using the developed photoresist film 142 as an etching mask so that the passivation layer 116 corresponding to the transparent portion 143c (shown in FIG. 8) is removed.

Figure 13:
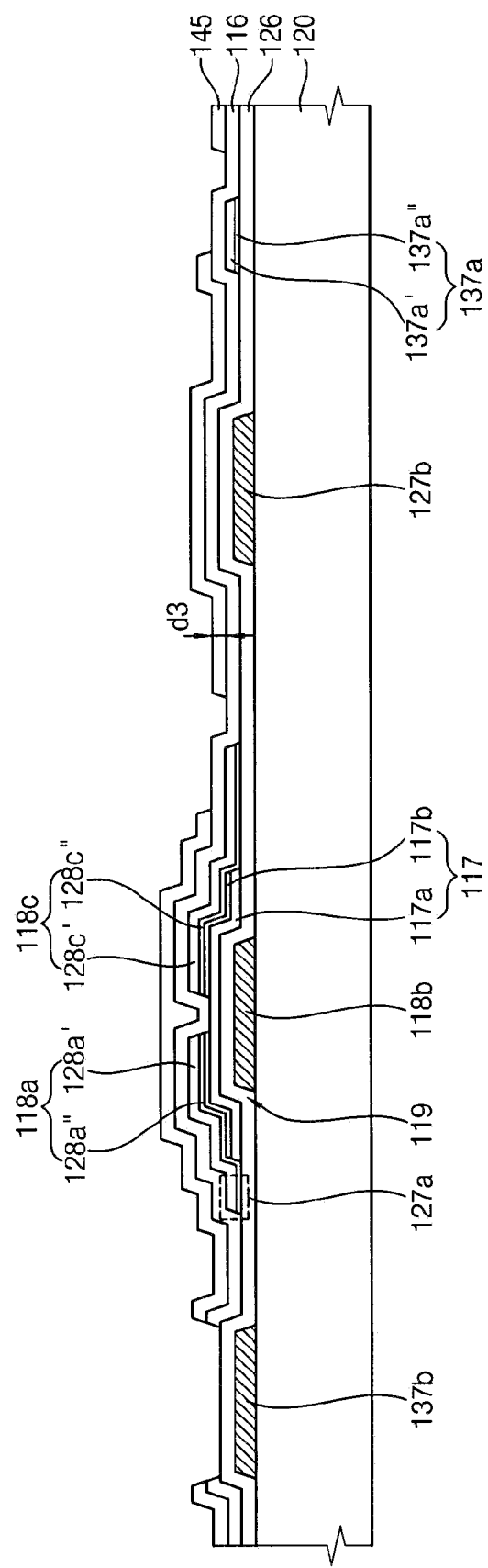

Referring to FIG. 13, an entire surface of the developed photoresist film 142 is removed to decrease a thickness of the developed photoresist film 142 so that the passivation layer 116 corresponding to the first and second translucent portions 143a and 143b (shown in FIG. 12) is exposed. In one exemplary embodiment, a substantially entire surface of the developed photoresist film 142 is ashed to decrease the thickness of the photoresist film 142 at a constant rate. In FIG. 13, the thickness of the developed photoresist film 142 (shown in FIG. 12) is decreased through an ashing process. A thickness d3 of the ashed photoresist film 145 corresponding to the opaque portion 143d (shown in FIG. 7) is smaller than the thickness d1 (shown in FIG. 12) of the developed photoresist film 142 corresponding to the opaque portion 143d (shown in FIG. 10).

Figure 14:
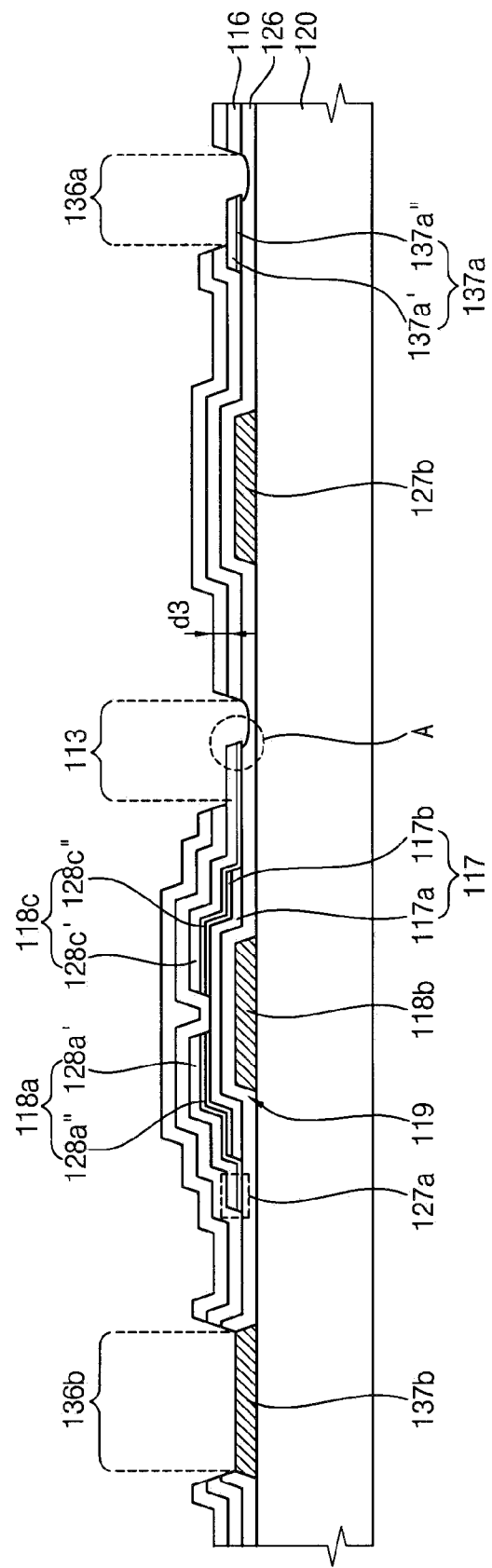
Figure 15:
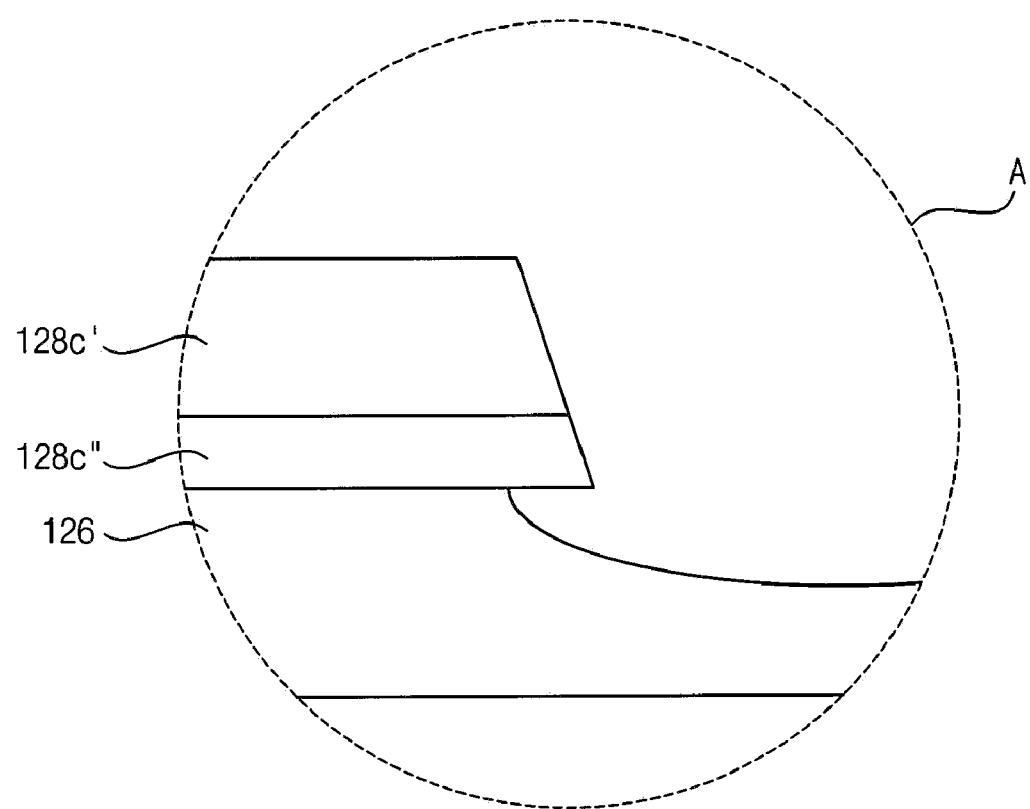

Referring to FIG. 14, the passivation layer 116 corresponding to the first and second contact holes 113 and 136a and the gate insulating layer 126 corresponding to the third contact hole 136b are second etched using the ashed photoresist film 145 (shown in FIG. 13) as an etching mask to form the first, second and third contact holes 113, 136a and 136b.

The gate and passivation layers 126 and 116 corresponding to the gate pad 137b are partially removed through the first and second etching processes to form the third contact hole 136b through which the gate pad 137b is partially exposed. That is, the third contact hole 136b is formed through the first and second etching processes.

The passivation layer 116 corresponding to the drain electrode 118c and the data pad 137a is partially removed through the second etching process to form the first and second contact holes 113 and 136a through which the drain electrode 118c and the data pad 137a are partially exposed, respectively. That is, the first and second contact holes 113 and 136a are formed through the second etching process. In exemplary embodiments, the first and second contact holes 113 and 136a may be formed through only the second etching process.

In exemplary embodiments, when the first, second and third contact holes are simultaneously formed through a single etching process, undercuts may be formed in the first and second contact holes. In the illustrated embodiments of FIGS. 8 to 15, the first, second and third contact holes 113, 136a and 136b are formed through the first and second etching processes to decrease a size of the undercut in the first and second contact holes 113 and 136a. In other alternative exemplary embodiments, a time period for the second etching process may be adjusted to decrease the undercut.

Figure 16:
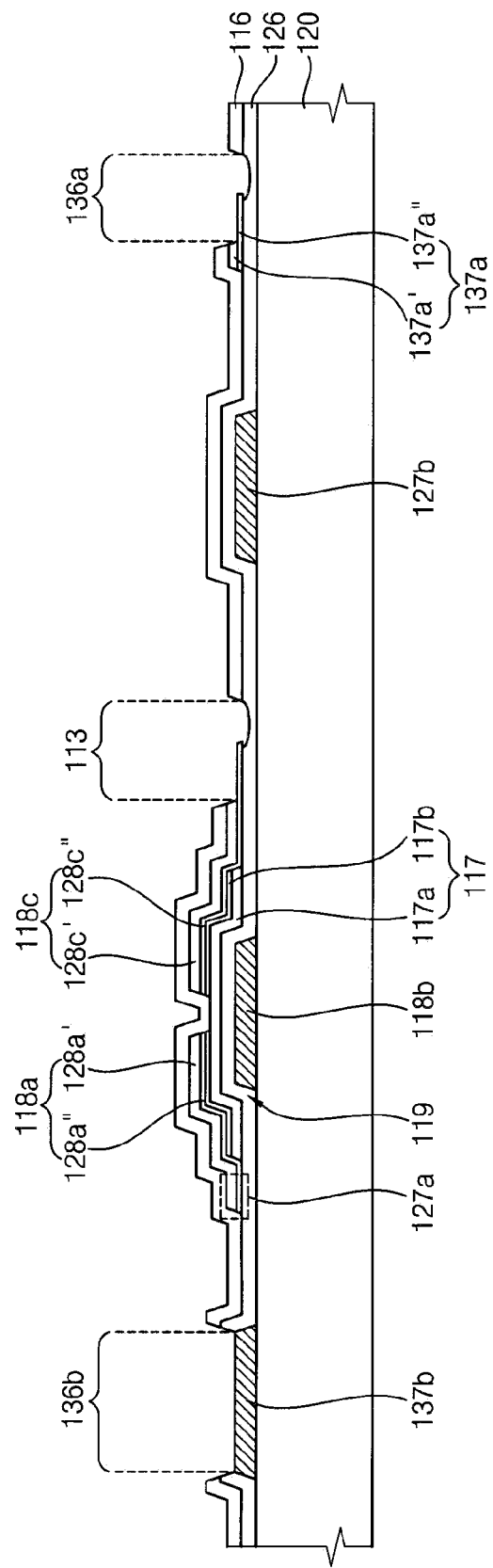

Referring to FIG. 16, the second drain metal pattern 128c' that is in the first contact hole 113 and the second data pad metal pattern 137a' that is in the second contact hole 136a are partially etched to prevent a Galvanic corrosion between the transparent conductive material of the pixel electrode 112 (shown in FIG. 2) and the aluminum of the second drain metal pattern 128c', and a Galvanic corrosion between the transparent conductive material of the first signal transmitting pattern 132a and the aluminum of the second data pad metal pattern 137a'. A remaining photoresist film 145 (shown in FIG. 14) is stripped from the passivation layer 116.

Figure 17:
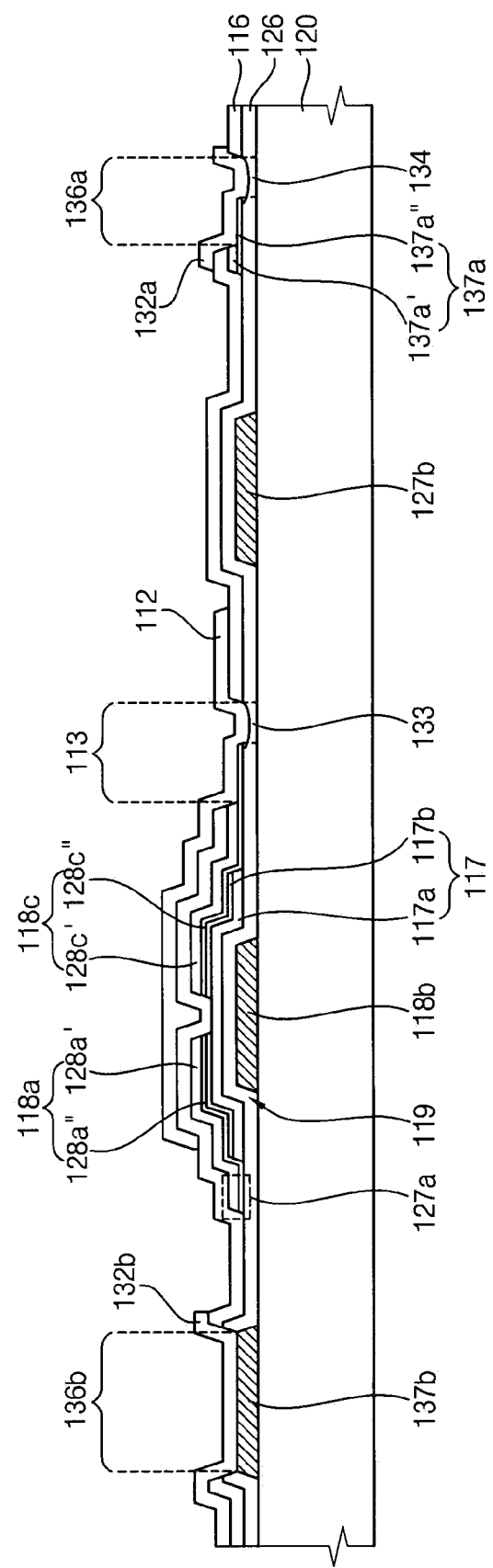

Referring to FIG. 17, a conductive transparent layer (not shown) is deposited on the passivation layer 116 having the first, second and third contact holes 113, 136a and 136b. The conductive transparent layer (not shown) is partially etched through a photolithography process using a fifth mask to form the pixel electrode 112, the first signal transmitting pattern 132a and the second signal transmitting pattern 132b.

In the illustrated embodiment of the method of manufacturing the array substrate shown in FIGS. 3 to 17, the first, second and third contact holes 113, 136a and 136b are formed through the first and second etching processes to decrease the size of the undercut in the first and second contact holes 113 and 136a.

In addition, the first slits 144a of the fourth mask 143 corresponding to the first contact hole 113 are aligned in substantially parallel with the second slits 144b of the fourth mask 143 corresponding to the second contact hole 136a so that the passivation layer 116 and the gate insulating layer 126 are uniformly etched.

Figure 18:
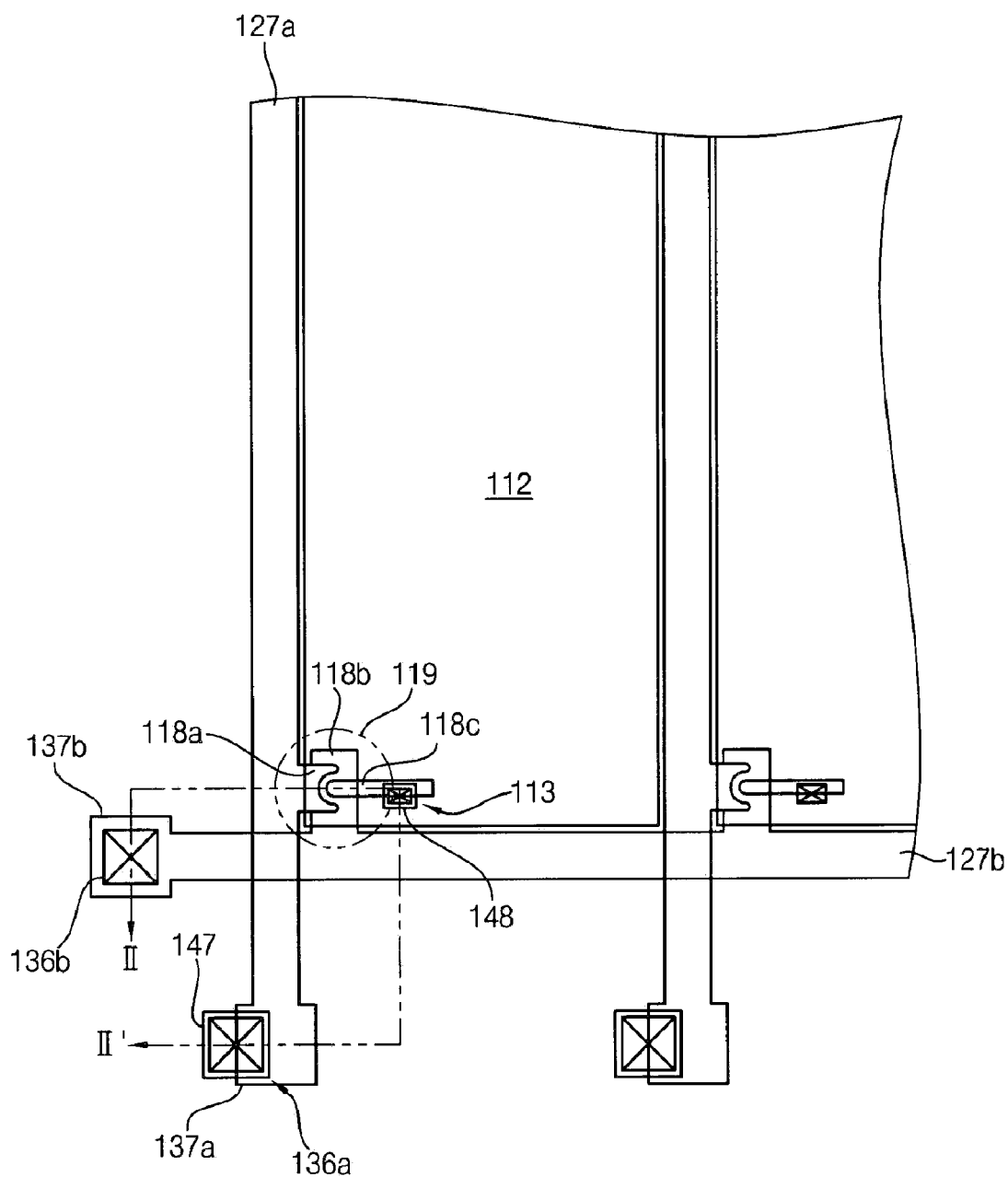
FIG. 18 is a plan view showing another exemplary embodiment of a display substrate in accordance with the present invention.
Figure 19:
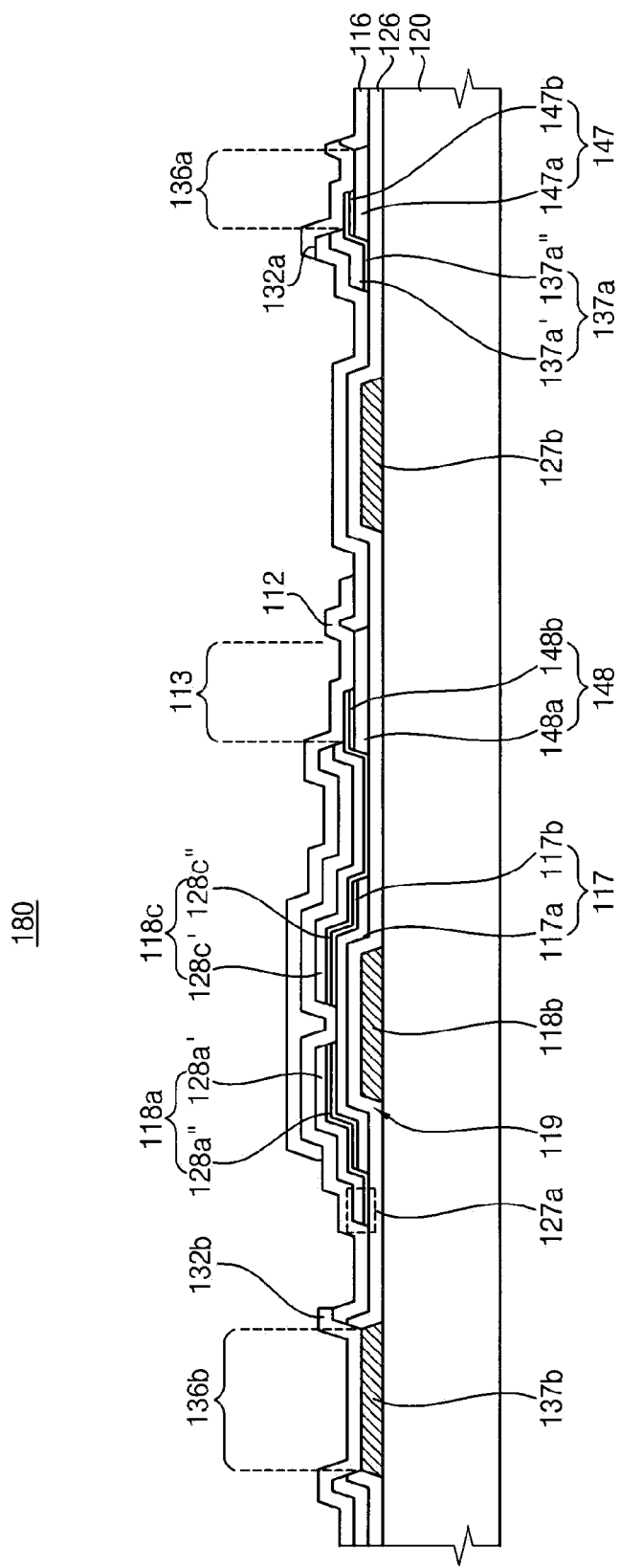
FIG. 19 is a cross-sectional view taken along line II-II' shown in FIG. 18.

FIG. 18 is a plan view showing another exemplary embodiment of a display substrate in accordance with the present invention. FIG. 19 is a cross-sectional view taken along line II-II' shown in FIG. 18. The display substrate of FIGS. 18 and 19 is the same as the display substrate in FIGS. 1 and 2 except an undercut compensating member. Thus, the same reference numerals will be used to refer to the same or like parts as those described in FIGS. 1 and 2 and any further explanation concerning the above elements will be omitted. In FIGS. 18 and 19, the display substrate is an array substrate for a display device.

Referring to FIGS. 18 and 19, the array substrate 180 includes a lower substrate 120, a thin film transistor 119, a data line 127a, a data pad 137a, a gate line 127b, a gate pad 137b, a storage capacitor (not shown), a gate insulating layer 126, a semiconductor layer pattern 117, a pixel electrode 112, a first signal transmitting pattern 132a, a second signal transmitting pattern 132b, a first undercut compensating member 148 and a second undercut compensating member 147. The data and gate lines 127a and 127b define a pixel.

The thin film transistor 119 is formed on the lower substrate 120, and includes a source electrode 118a, a gate electrode 118b, a drain electrode 118c and a semiconductor layer pattern 117.

The gate insulating layer 126 includes a third contact hole 136b through which the gate pad 137b is partially exposed.

The semiconductor layer pattern 117 is formed on the gate insulating layer 126 corresponding to the gate electrode 118b. The semiconductor layer pattern 117 includes an amorphous silicon pattern 117a and an N+ amorphous silicon pattern 117b. The amorphous silicon pattern 117a is formed on the gate insulating layer 126. The N+ amorphous silicon pattern 117b is formed on the amorphous silicon pattern 117a, and includes two N+ amorphous silicon portions that are spaced apart from each other and correspond to the source and drain electrodes 118a and 118c, respectively.

The first undercut compensating member 148 is formed on the gate insulating layer 126 corresponding to a first contact hole 113 of the passivation layer 116. The first undercut compensating member 148 includes a first lower undercut compensating pattern 148a and a first upper undercut compensating pattern 148b. The first lower undercut compensating pattern 148a is formed on the gate insulating layer 126. The first upper undercut compensating pattern 148b is interposed between the first lower undercut compensating pattern 148a and the drain electrode 118c. The first lower undercut compensating pattern 148a is partially exposed through the first contact hole 113. An etching rate of the first undercut compensating member 148 is smaller than an etching rate of the gate insulating layer 126 to decrease an undercut under the drain electrode 118c.

The second undercut compensating member 147 is formed on the gate insulating layer 126 corresponding to a second contact hole 136a of the passivation layer 116. The second undercut compensating member 147 includes a second lower undercut compensating pattern 147a and a second upper undercut compensating pattern 147b. The second lower undercut compensating pattern 147a is formed on the gate insulating layer 126. The second upper undercut compensating pattern 147b is interposed between the second lower undercut compensating pattern 147a and the data pad 137a. The second lower undercut compensating pattern 147a is partially exposed through the second contact hole 136a. An etching rate of the second undercut compensating member 147 is smaller than the etching rate of the gate insulating layer 126 to decrease an undercut under the data pad 137a.

The drain electrode 118c is formed on the gate insulating layer 126 having the semiconductor layer pattern 117 and the first undercut compensating member 148 to be electrically connected to the pixel electrode 112 through the first contact hole 113. In FIGS. 18 and 19, the drain electrode 118c includes a first drain metal pattern 128c" and a second drain metal pattern 128c'. The first drain metal pattern 128c" is formed on the semiconductor layer pattern 117 and the first undercut compensating member 148. The second drain metal pattern 128c' is formed on the first drain metal pattern 128c".

The first drain metal pattern 128c" includes a first metal. The first metal that can be used for the first drain metal pattern 128c" includes, but is not limited to, chromium, molybdenum and neodymium. These materials can be used alone or in a combination thereof. The second drain metal pattern 128c' includes a second metal. The second metal that can be used for the second drain metal pattern 128c' includes, but is not limited to, aluminum and copper. These materials can be used alone or in a combination thereof. In the illustrated embodiment of FIGS. 18 and 19, the first and second drain metal patterns 128c" and 128c' include chromium and aluminum, respectively.

In alternative exemplary embodiments, the drain electrode 118c may have a single layered structure or a multi layered structure having no less than three layers. The first drain metal pattern 128c" may have a size (such as an area) greater than that of the second drain metal pattern 128c' so that a portion of the first drain metal pattern 128c" is exposed through the first contact hole 113. That is, the second drain metal pattern 128c' in the first contact hole 113 is partially removed so that the first drain metal pattern 128c" has the size greater than that of the second drain metal pattern 128c'.

The data pad 137a is formed on the gate insulating layer 126 and the second undercut compensating member 147 to be electrically connected to the first signal transmitting pattern 132a through the second contact hole 136a. In FIGS. 18 and 19, the data pad 137a includes a first data pad metal pattern 137a" and a second data pad metal pattern 137a'. The first data pad metal pattern 137a" is formed on the gate insulating layer 126 and the second undercut compensating member 147. The second data pad metal pattern 137a' is formed on the first data pad metal pattern 137a'. Each of the first and second data pad metal patterns 137a" and 137a' may include a material substantially the same as that of each of the first and second data metal patterns 128c" and 128c' discussed above. The first data pad metal pattern 137c" may have a size greater than that of the second data pad metal pattern 137c' so that a portion of the first data pad metal pattern 137c" is exposed through the second contact hole 136a. That is, the second data pad metal pattern 137c' in the second contact hole 136a is partially removed so that the first data pad metal pattern 137c" has the size greater than that of the second data pad metal pattern 137c'.

The passivation layer 116 is formed on the gate insulating layer 126 having the thin film transistor 119, the gate line 127b, the gate pad 137b, the data line 127a, the data pad 137a, the first undercut compensating member 148 and the second undercut compensating member 147. The passivation layer 116 has the first contact hole 113, the second contact hole 136a and the third contact hole 136b. A portion of the first drain metal pattern 128c" of the drain electrode 118c and the first undercut compensating member 148 are exposed through the first contact hole 113. A portion of the first data pad metal pattern 137a" of the data pad 137a and the second undercut compensating member 147 are exposed through the second contact hole 136a. The third contact hole 136b is formed through the gate insulating layer 126 and the passivation layer 116 and the gate pad 137b is partially exposed through the third contact hole 136b.

The pixel electrode 112 is formed on the passivation layer 116 having the first contact hole 113 corresponding to the pixel to be electrically connected to the drain electrode 118c through the first contact hole 113.

In the illustrated embodiments shown in FIGS. 18 and 19, the first and second undercut compensating members 148 and 147 are formed on the gate insulating layer 126 to improve the contact characteristics of the second contact hole 136a.

FIGS. 20 to 30 are cross-sectional views showing an exemplary embodiment of a method of manufacturing the display substrate shown in FIG. 18.

Figure 20:
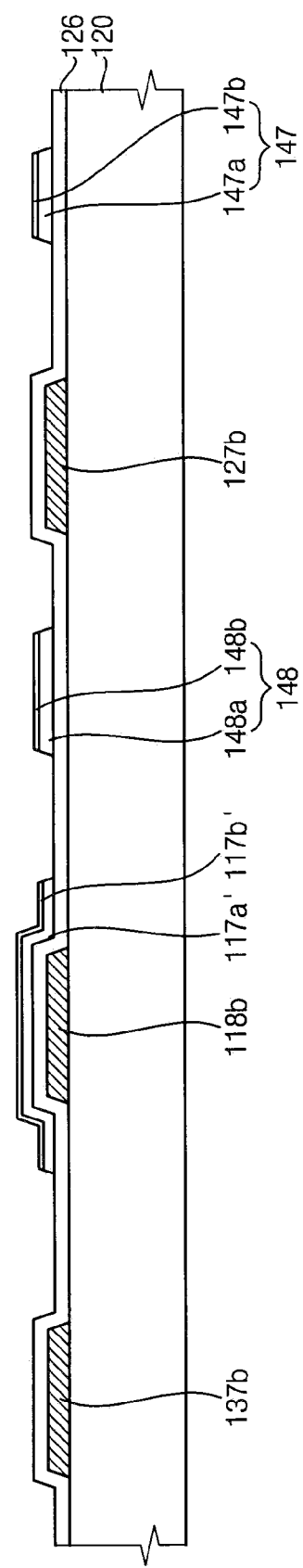
FIGS. 20 to 30 are cross-sectional views showing an exemplary embodiment of a method of manufacturing the display substrate shown in FIG. 18.

Referring to FIG. 20, the gate electrode 118b, the gate line 127b and the gate pad 137b are formed on the lower substrate 120. The gate insulating layer 126 is deposited on the lower substrate 120 having the gate electrode 118b, the gate line 127b and the gate pad 137b.

A base amorphous silicon layer (not shown) is deposited on the gate insulating layer 126. N+ ions are implanted on an upper portion of the base amorphous silicon layer (not shown) to form an amorphous silicon layer (not shown) on the gate insulating layer 126 and an N+ amorphous silicon layer (not shown) on the amorphous silicon layer (not shown). The amorphous silicon layer (not shown) and the N+ amorphous silicon layer (not shown) are partially etched to form a primary amorphous silicon layer 117a', a primary N+ amorphous silicon layer 117b', the first undercut compensating member 148 and the second undercut compensating member 147. The primary amorphous silicon layer 117a' and the primary N+ amorphous silicon layer 117b' correspond to the gate electrode 118b. The first undercut compensating member 148 corresponds to the first contact hole 113. The second undercut compensating member 147 corresponds to the second contact hole 136a.

Figure 21:
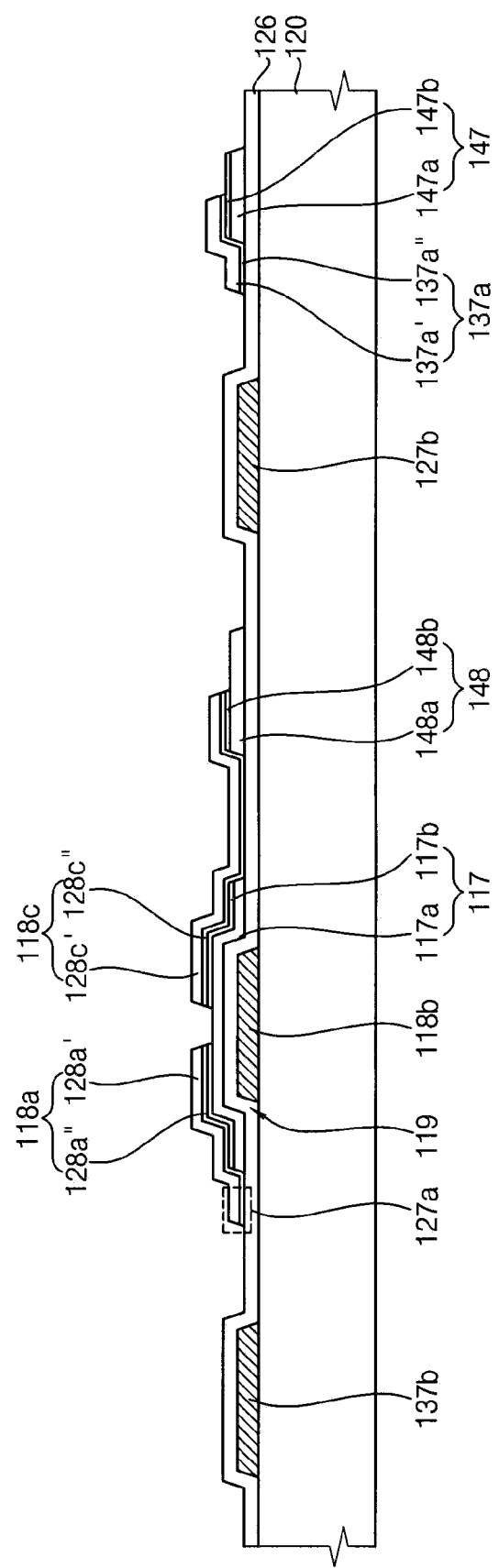

Referring to FIG. 21, a first metal layer (not shown) is deposited on the gate insulating layer 126 having the primary amorphous silicon layer 117a', the primary N+ amorphous silicon layer 117b', the first undercut compensating member 148 and the second undercut compensating member 147. A second metal layer (not shown) is deposited on the first metal layer (not shown). In FIG. 21, the first metal layer (not shown) includes chromium, and the second metal layer (not shown) includes aluminum.

The first and second metal layers (not shown) are partially removed to form the source electrode 118a, the drain electrode 118c, the data line 127a and the data pad 137a. In one exemplary embodiment, the first and second metal layers (not shown) may be partially removed through an etching process. The first source metal pattern 128a" of source electrode 118a, the first drain metal pattern 128c" of the drain electrode 118c, the first data line metal pattern of the data line 127a and the first data metal pattern 137a" of the data pad 137a are formed from the first metal layer (not shown). In addition, the second source metal pattern 128a' of source electrode 118a, the second drain metal pattern 128c' of the drain electrode 118c, the second data line metal pattern of the data line 127a and the second data metal pattern 137a' of the data pad 137a are formed from the second metal layer (not shown).

A portion of the primary N+ amorphous silicon layer 117b' between the source and drain electrodes 118a and 118c is removed to form the semiconductor layer pattern 117 having the amorphous silicon layer 117a and the N+ amorphous silicon layer 117b. In FIG. 21, the portion of the primary N+ amorphous silicon layer 117b' between the source and drain electrodes 118a and 118c may be etched using the source and drain electrodes 118a and 118c as an etching mask to form the semiconductor layer pattern 117 having the amorphous silicon layer 117a and the N+ amorphous silicon layer 117b.

Figure 22:
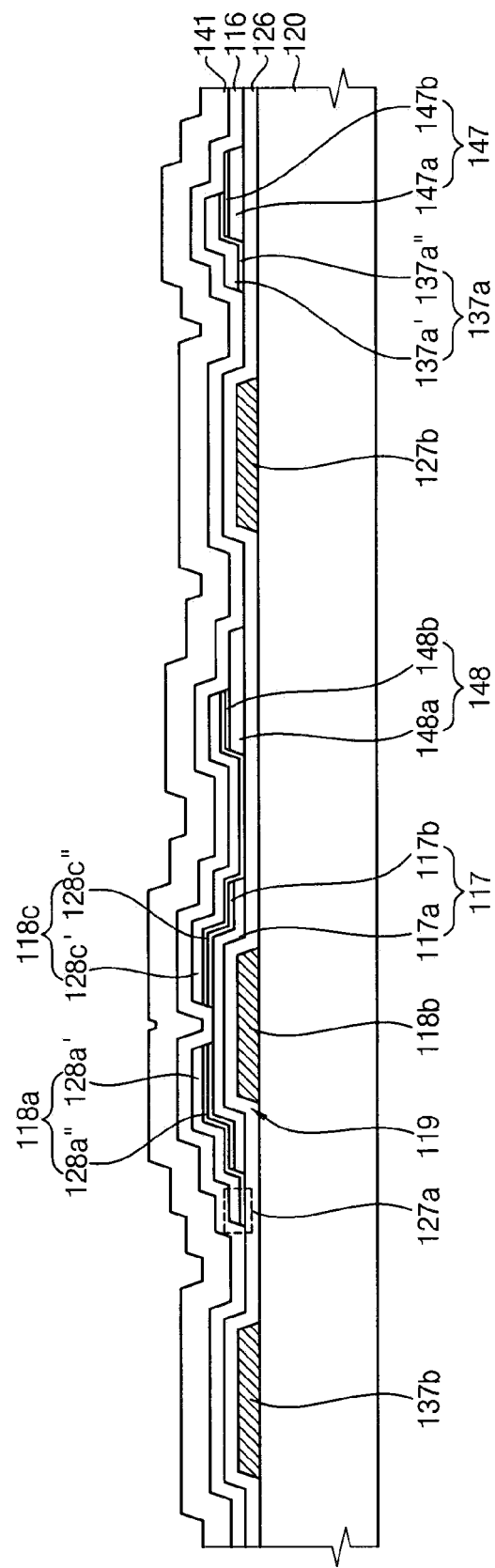

Referring to FIG. 22, the passivation layer 116 is deposited on the gate insulating layer 126 having the semiconductor layer pattern 117, the source electrode 118a, the drain electrode 118c, the data line 127a, the data pad 137a, the first undercut compensating member 148 and the second undercut compensating member 147. The gate pad 137b and the gate line 127b are under the gate insulating layer 126 and the passivation layer 116. The source electrode 118a, the drain electrode 118c, the data line 127a, the data pad 137a, the first undercut compensating member 148 and the second undercut compensating member 147 are between the gate insulating layer 126 and the passivation layer 116. A photoresist film 141 is formed on the passivation layer 116. In one exemplary embodiment, the photoresist film 141 may be coated on the passivation layer 116.

Figure 23:
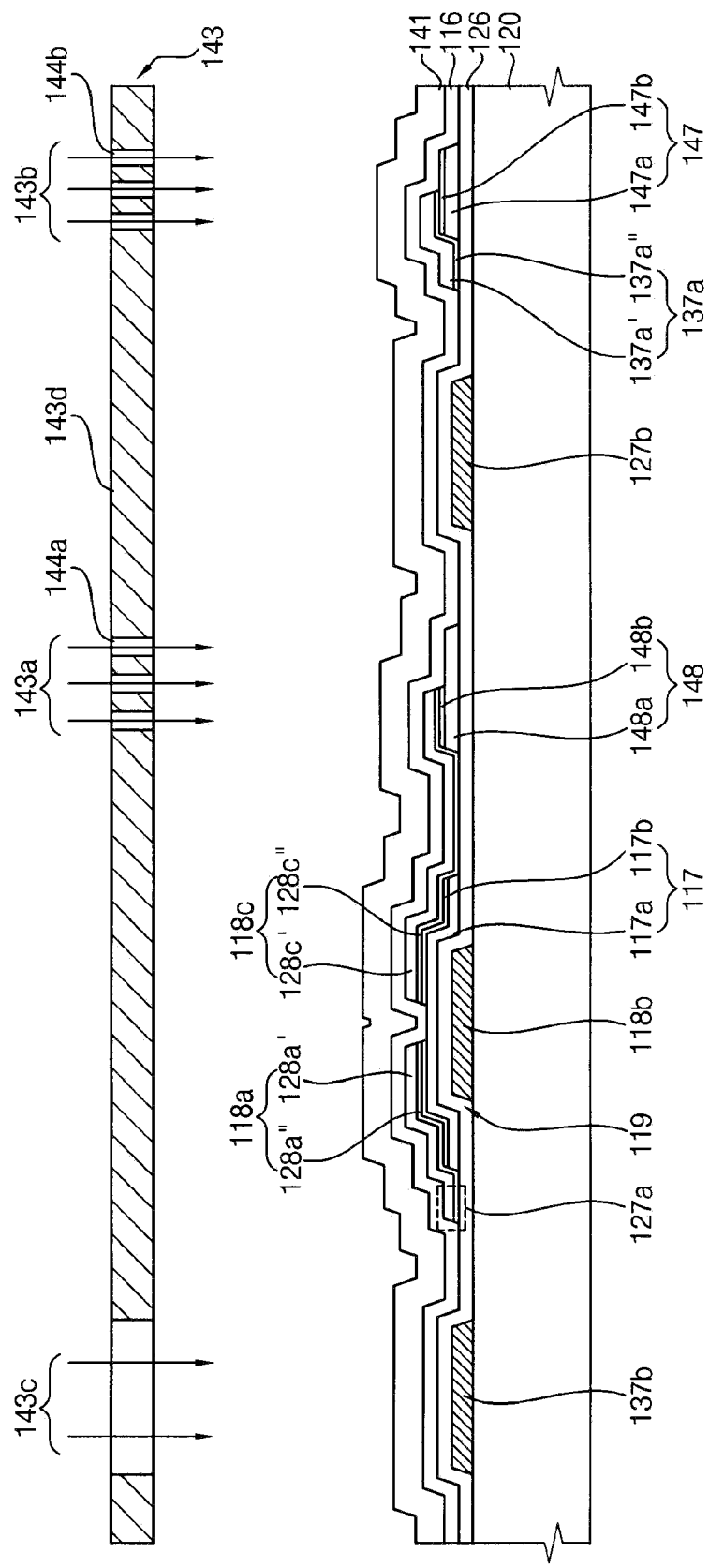

Referring to FIG. 23, the photoresist film 141 is exposed through a fourth mask 143. The fourth mask 143 includes a first translucent portion 143a, a second translucent portion 143b, a transparent portion 143c and an opaque portion 143d.

The first translucent portion 143a corresponds to the first contact hole 113 (shown in FIG. 19). That is, the first translucent portion 143a corresponds to an end portion of the drain electrode 118c and a portion of the first undercut compensating member 148 adjacent to the end portion of the drain electrode 118c.

The second translucent portion 143b corresponds to the second contact hole 136a (shown in FIG. 19). That is, the second translucent portion 143b corresponds to an end portion of the data pad 137a and a portion of the second undercut compensating member 147 adjacent to the end portion of the data pad 137a.

The first translucent portion 143a includes a plurality of first slits 144a arranged substantially in parallel with each other. The second translucent portion 143b includes a plurality of second slits 144b arranged substantially in parallel with each other. In the illustrated embodiment of FIG. 23, the first and second slits 144a and 144b are substantially in parallel with each other. The photoresist film 141 is exposed through the fourth mask 143, such as through a line scanning method.

In the line scanning method, light irradiated onto the photoresist film 141 through the fourth mask 143 has a substantially linear cross-section. In an alternative exemplary embodiment, a light having an extended elliptical cross-section may be irradiated onto the photoresist film 141 through the fourth mask 143. The first slits 144a are arranged in a direction substantially the same as that of the second slits 144b so that the light having passed through the first slits 144a may have an intensity substantially the same as that of the light having passed through the second slits 144b so that the passivation layer 116 and the gate insulating layer 126 may be uniformly etched.

The transparent portion 143c corresponds to the gate pad 137b. Light having passed through the transparent portion 143c has an intensity greater than that of the light having passed through the first and second translucent portions 143a and 143b.

The opaque portion 143d is interposed among the first translucent portions 143a, the second translucent portion 143b and the transparent portion 143c.

Figure 24:
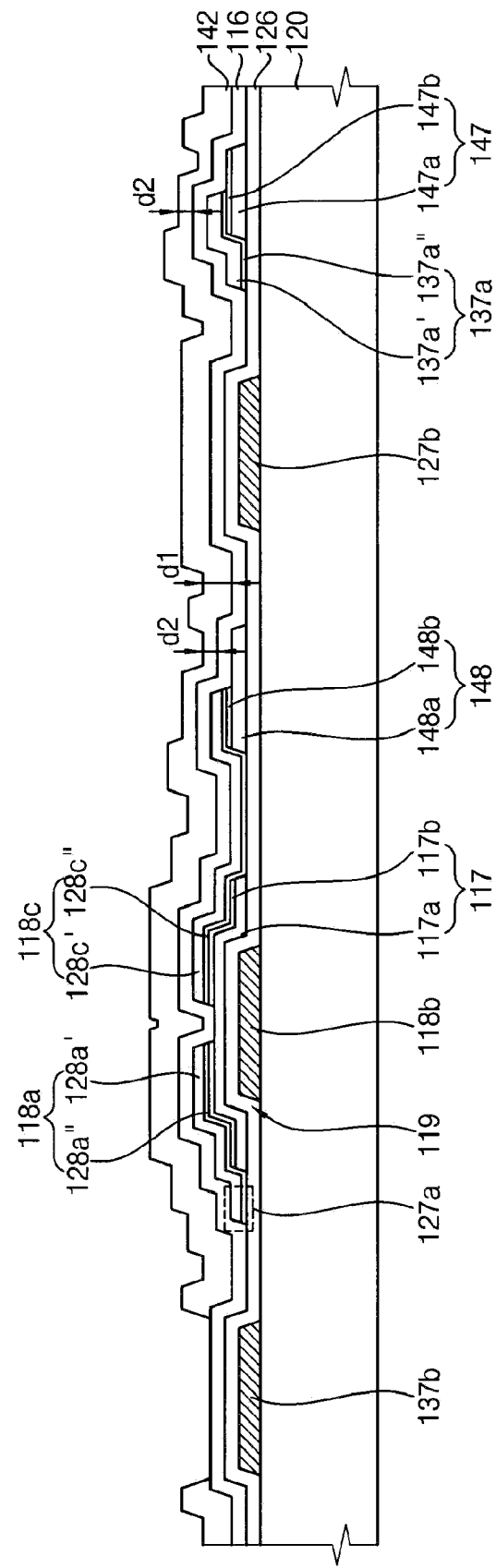

Referring to FIG. 24, the exposed photoresist film 141 is developed. The developed photoresist film 142 has various thicknesses. A thickness d2 of the developed photoresist film 142 corresponding to the first and second translucent portions 143a and 143b (shown in FIG. 23) is smaller than a thickness d1 of the developed photoresist film 142 corresponding to the opaque portion 143d (shown in FIG. 23). A portion of the developed photoresist film 142 corresponding to the transparent portion 143c (shown in FIG. 23) is removed so that the passivation layer 116 is partially exposed.

Figure 25:
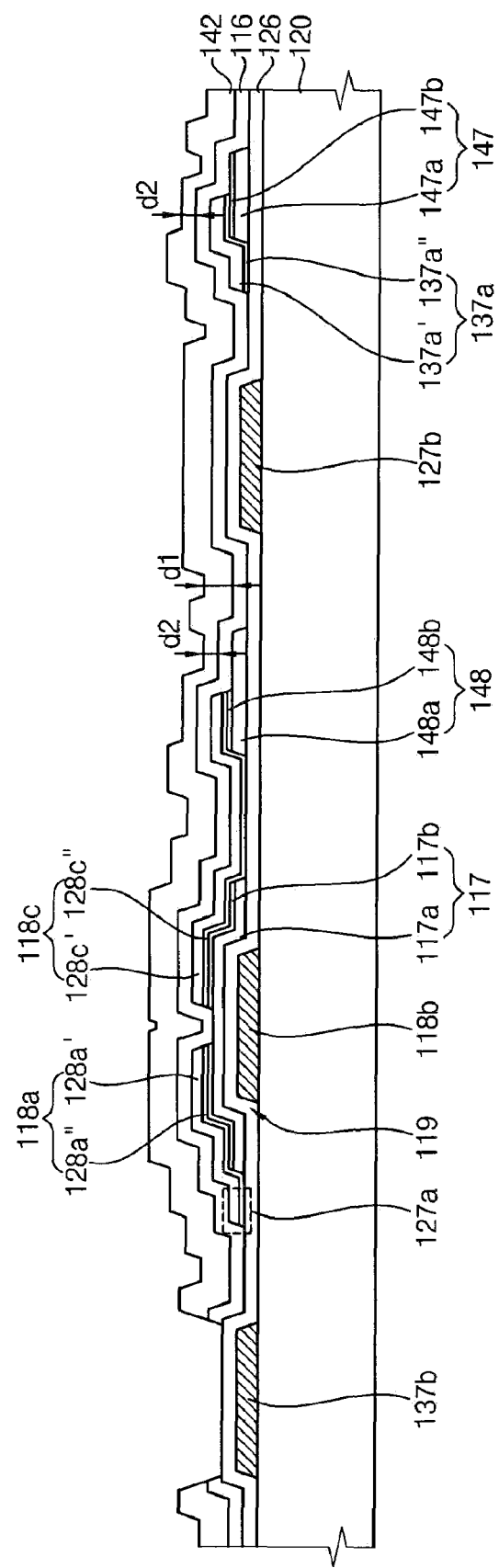

Referring to FIG. 25, the passivation layer 116 is first etched using the developed photoresist film 142 as an etching mask so that the passivation layer 116 corresponding to the transparent portion 143c (shown in FIG. 23) is removed.

Figure 26:
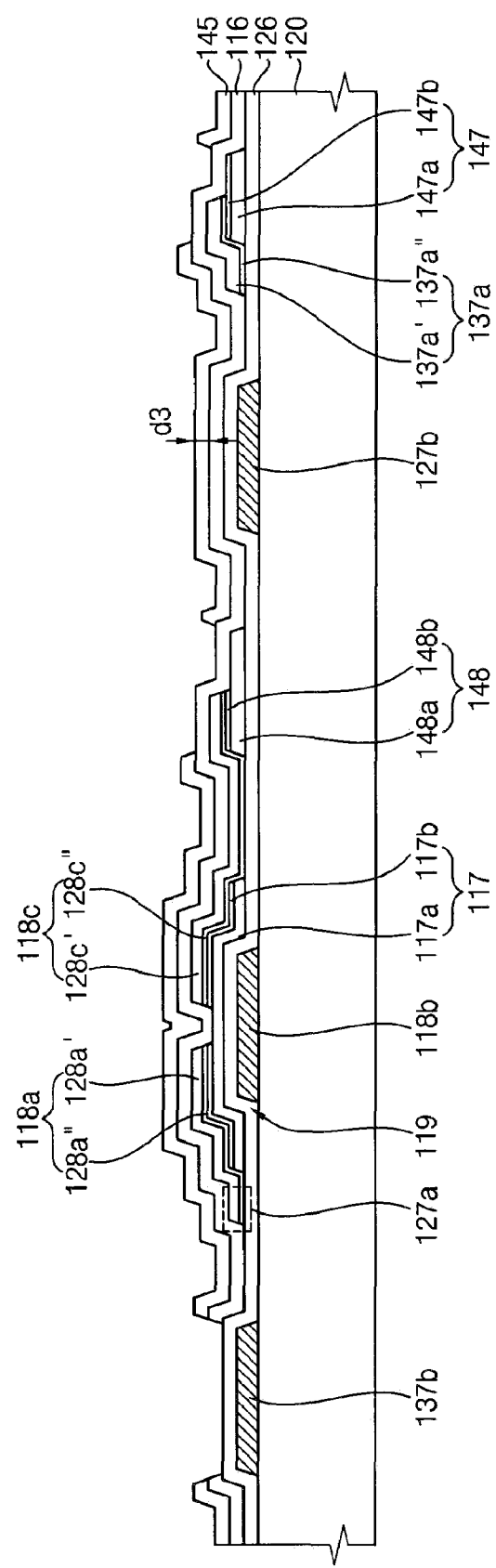

Referring to FIG. 26, an entire surface of the developed photoresist film 142 is removed to decrease a thickness of the developed photoresist film 142 so that the passivation layer 116 corresponding to the first and second translucent portions 143a and 143b (shown in FIG. 23) is exposed. In the illustrated embodiment of FIG. 26, the thickness of the developed photoresist film 142 (shown in FIG. 23) is decreased through an ashing process. A thickness d3 of the ashed photoresist film 145 corresponding to the opaque portion 143d is smaller than the thickness d1 of the developed photoresist film 142 corresponding to the opaque portion 143d.

Figure 27:
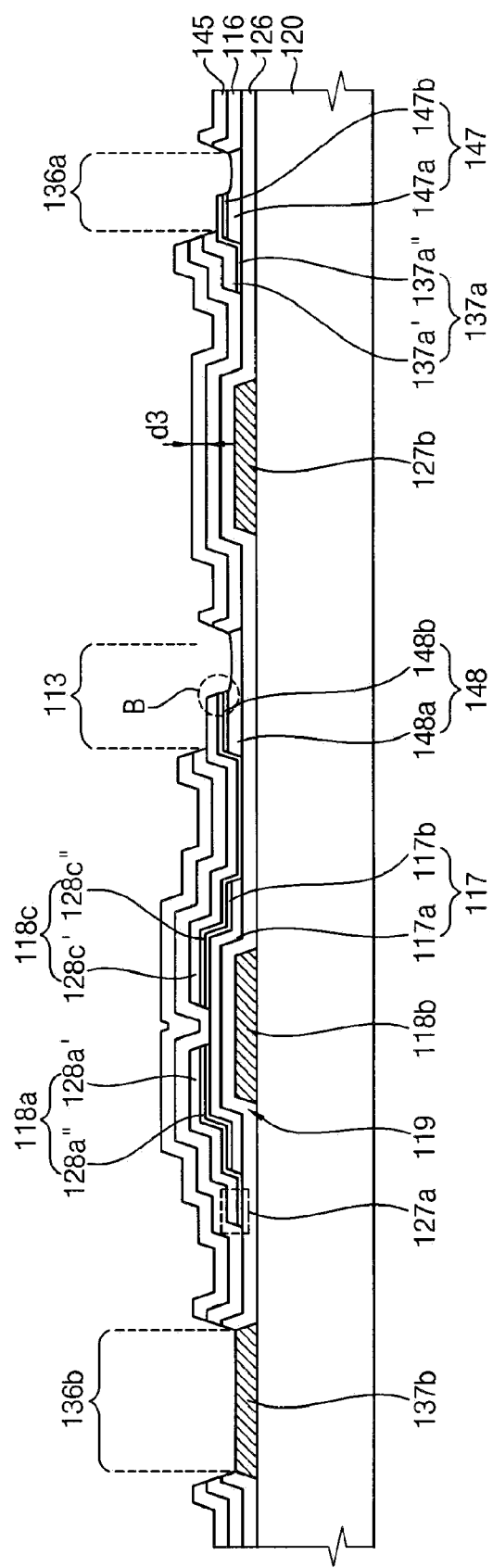
Figure 28:
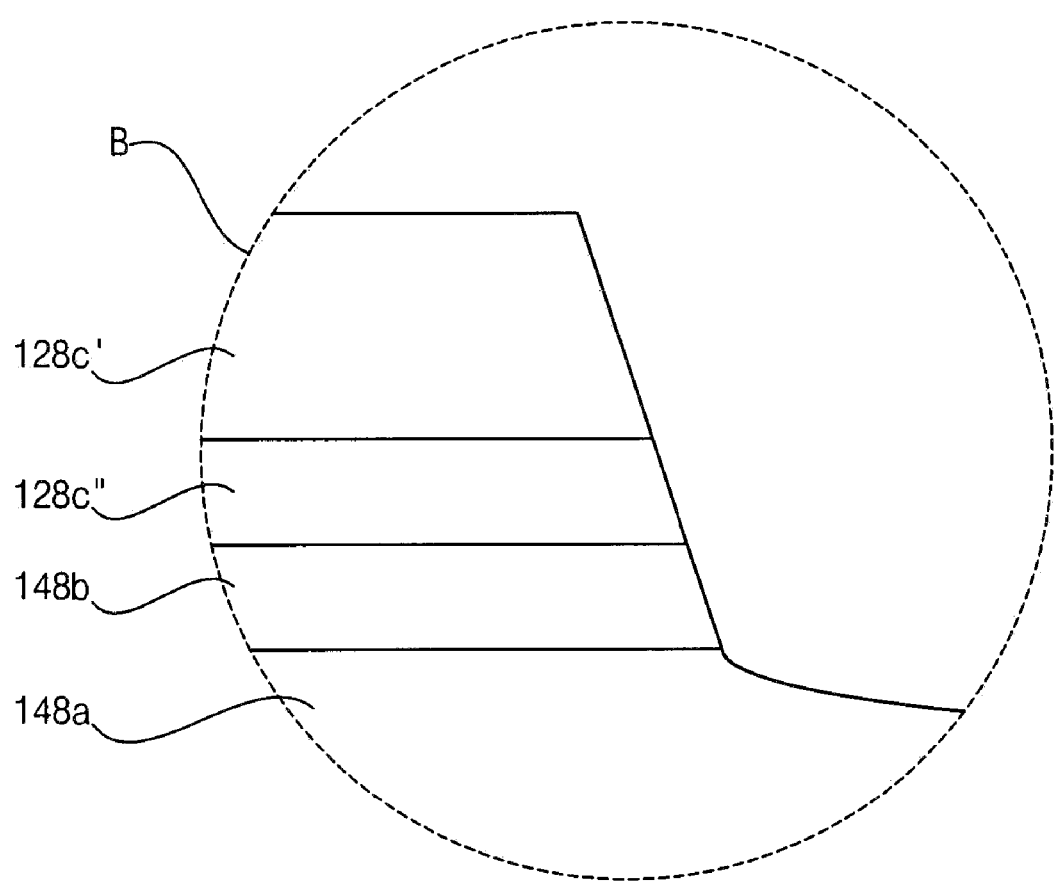

Referring to FIGS. 27 and 28, the passivation layer 116 corresponding to the first and second contact holes 113 and 136a and the gate insulating layer 126 corresponding to the third contact hole 136b are second etched using the ashed photoresist film 145 as an etching mask to form the first, second and third contact holes 113, 136a and 136b. An upper portion of the first undercut compensating member 148 corresponding to the first contact hole 113 and an upper portion of the second undercut compensating member 147 corresponding to the second contact hole 136a may also be partially removed through the second etching process.

Figure 29:
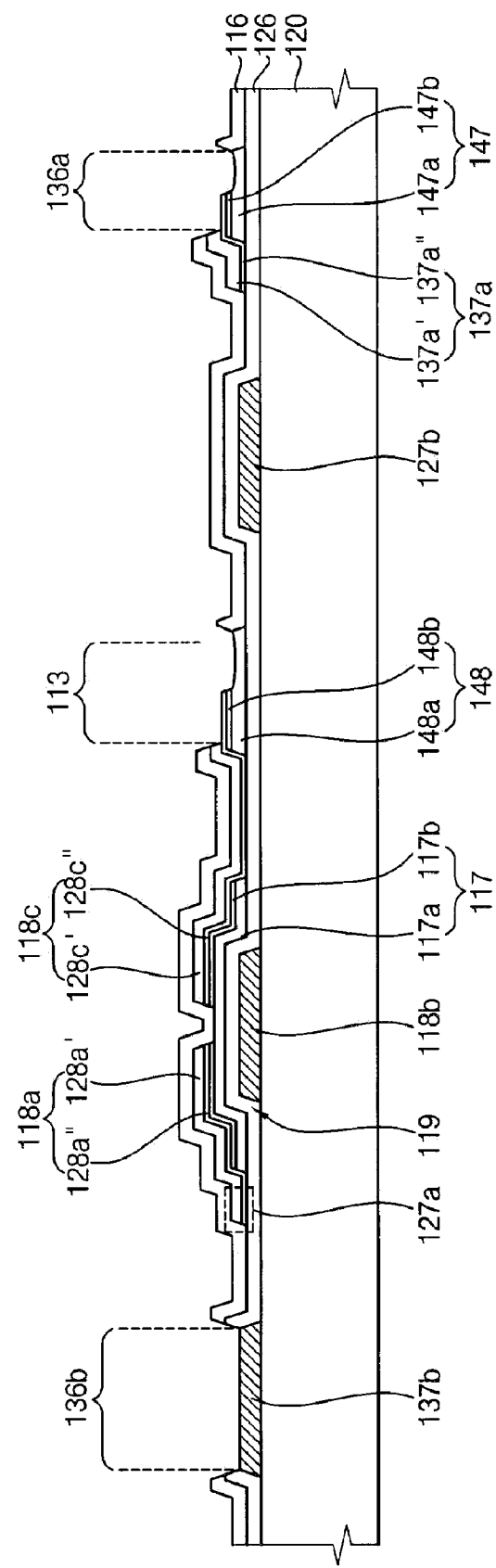

Referring to FIG. 29, the second drain metal pattern 128c' that is in the first contact hole 113 and the second data pad metal pattern 137a' that is in the second contact hole 136a are partially etched to prevent a Galvanic corrosion between the transparent conductive material of the pixel electrode 112 (shown in FIG. 19) and the aluminum of the second drain metal pattern 128c', and a Galvanic corrosion between the transparent conductive material of the first signal transmitting pattern 132a and the aluminum of the second data pad metal pattern 137a'. A remaining photoresist film 145 (shown in FIG. 27) is stripped from the passivation layer 116.

Figure 30:
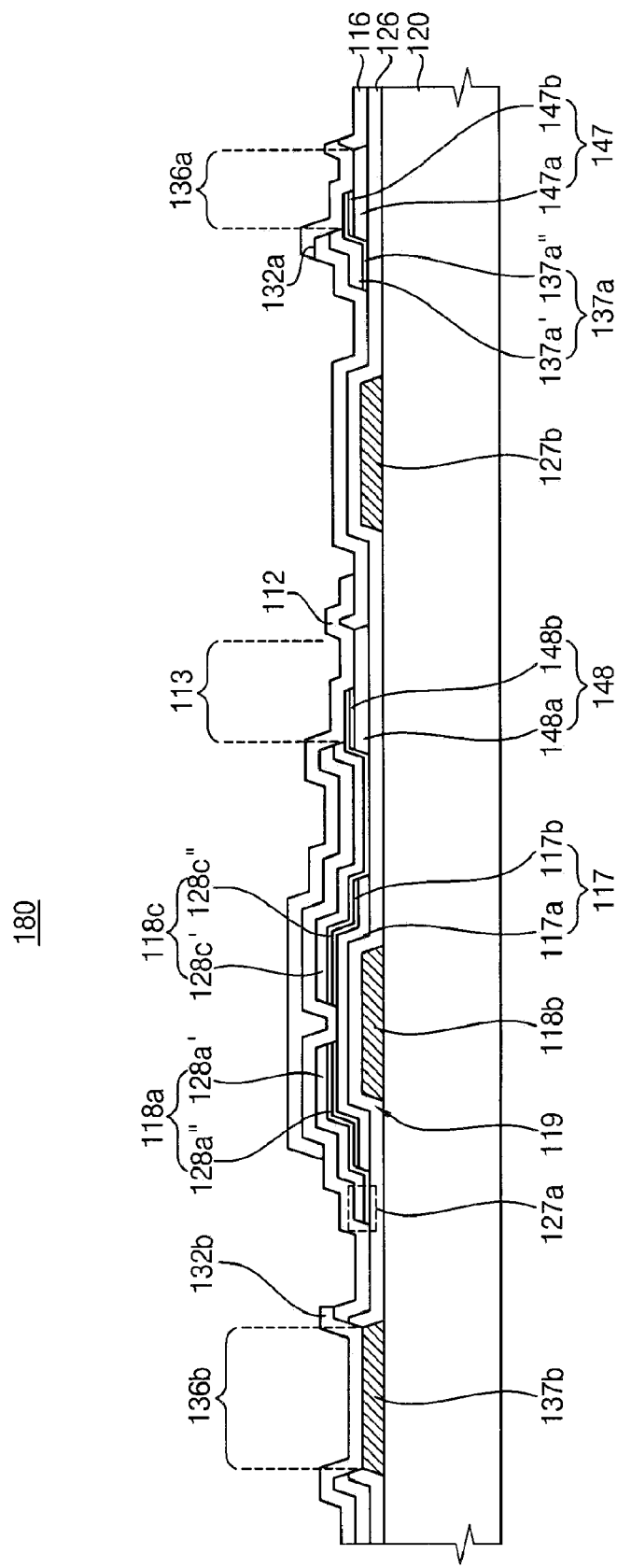

Referring to FIG. 30, the pixel electrode 112, the first signal transmitting pattern 132a and the second signal transmitting pattern 132b are formed on the passivation layer 116 having the first, second and third contact holes 113, 136a and 136b.

In the illustrated embodiment shown in FIGS. 20 to 30, the first undercut compensating member 148 is interposed between the gate insulating layer 126 and the drain electrode 118c to decrease an undercut in the first contact hole 113. In addition, the second undercut compensating member 147 is interposed between the gate insulating layer 126 and the data pad 137a to decrease the undercut in the second contact hole 136a.

Figure 31:
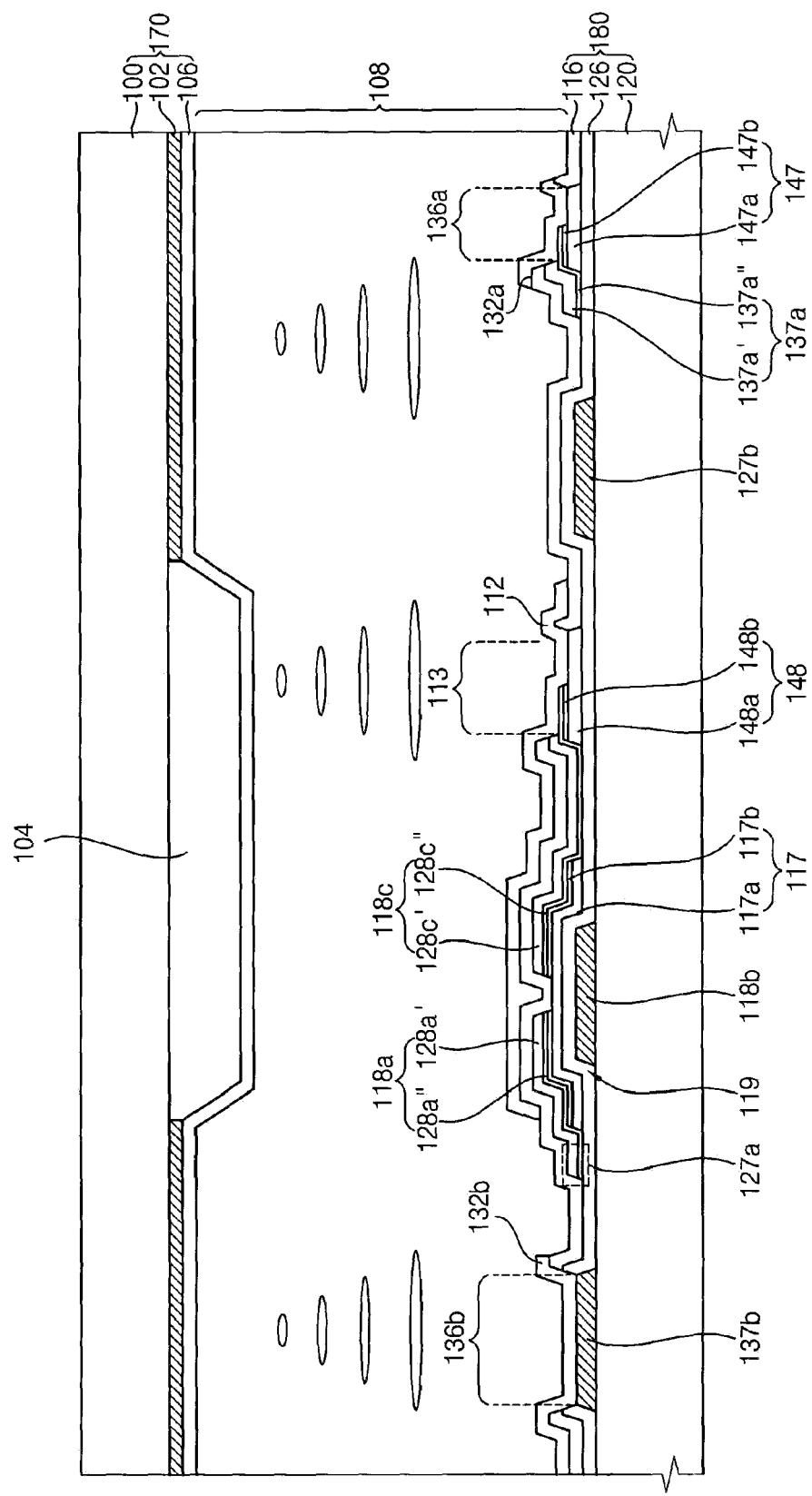
FIG. 31 is a cross-sectional view showing an exemplary embodiment of a display device in accordance with the present invention.

FIG. 31 is a cross-sectional view showing an exemplary embodiment of a display device in accordance with the present invention. An array substrate in FIG. 31 is the same as those shown in FIGS. 1, 2, 18 and 19. Thus, the same reference numerals will be used to refer to the same or like parts as those described in FIGS. 1, 2, 18 and 19 and any further explanation concerning the above elements will be omitted.

Referring to FIG. 31, the display device includes an array substrate 180, a liquid crystal layer 108 and a color filter substrate 170.

The color filter substrate 170 includes an upper substrate 100, a black matrix 102, a color filter 104 and a common electrode 106.

The upper substrate 100 may include a transparent material such as a transparent glass or a transparent quartz. In FIG. 31, the upper substrate 100 includes a material substantially the same as that of a lower substrate 120.

The black matrix 102 is formed on the upper substrate 100 to block light passing through a region in which liquid crystals of the liquid crystal layer 108 is incontrollable, thereby improving an image display quality.

In exemplary embodiments, an opaque organic material including photoresist is formed on the upper substrate 100 to form the black matrix 102 through a photo process. In one exemplary embodiment, the opaque organic material including the photoresist may be formed on the upper substrate 100. The opaque organic material may include, but is not limited to carbon black, a pigment compound and a colorant compound. These materials can be used alone or in a combination thereof. In one exemplary embodiment, the pigment compound may include a red pigment, a green pigment and/or a blue pigment, and the colorant compound may include a red colorant, a green colorant and/or a blue colorant. In alternative exemplary embodiments, a metallic material may be deposited on the upper substrate 100 and partially etched to form the black matrix 102. The metallic material of the black matrix 102 may include, but is not limited to, chrome (Cr), chrome oxide (CrOx) and chrome nitride (CrNx). These materials can be used alone or in a combination thereof.

The color filter 104 is formed on the upper substrate 100 corresponding to a pixel of the array substrate 180 to transmit light having a predetermined wavelength. The color filter 104 may include portions including any of a number of colors. IN one exemplary embodiment, the color filer 104 includes a red color filter portion, a green color filter portion and a blue color filter portion. The color filter 104 may also include other materials such as a photo initiator, a monomer, a binder, a pigment, a dispersant, a solvent and/or a photoresist. Alternative embodiments include configurations where the color filter 104 may be on the lower substrate 120 or a passivation layer 116 of the array substrate 180.

The common electrode 106 is formed on the upper substrate 100 having the black matrix 102 and the color filter 104. The common electrode 106 may include a transparent conductive material. The transparent conductive material that can be used for the common electrode 106 may include, but is not limited to, indium tin oxide (ITO), tin oxide (TO), indium zinc oxide (IZO), zinc oxide (ZO), indium tin zinc oxide (ITZO) and amorphous indium tin oxide (a-ITO). These materials can be used alone or in a combination thereof. Alternative embodiments include configurations where the common electrode 106 may be on the lower substrate 120 substantially in parallel with a pixel electrode 112 of the array substrate 180.

The color filter substrate 170 is spaced apart from the array substrate 180 by a spacer (not shown). The spacer may include any of a number of shapes as is suitable for the purpose described herein. In one exemplary embodiment, the spaces may have a substantially column shape and/or a ball shape. Alternative embodiments include configurations where the spacer 110 may include a mixture of the column shaped spacer and the ball shaped spacer.

The liquid crystal layer 108 is interposed between the color filter substrate 170 and the array substrate 180, and sealed by a sealant (not shown). The liquid crystal layer 108 may include a vertical alignment (VA) mode, a twisted nematic (TN) mode, a mixed twisted nematic (MTN) mode, a homogeneous alignment mode and any combination including at least one of the foregoing.

In the illustrated embodiments of FIGS. 1 to 31, the thin film transistor 119 has an inverted staggered structure. In the inverted staggered structure, the semiconductor layer pattern 117 is on the gate electrode 118b. Alternative embodiments include configurations where the thin film transistor 119 may have a staggered structure. In the staggered structure, the gate electrode 118b is on the semiconductor layer pattern 117.

In an exemplary embodiments, the undercut compensating portion is formed on the gate insulating layer, and the contact hole of the passivation layer is formed on the conductive pattern that is formed on the gate insulating layer and the undercut compensating portion to improve the contact characteristics of the contact hole. In addition, the undercut compensating portion may be formed in the gate insulating layer.

In another exemplary embodiment, a plurality of contact holes is formed through a plurality of etching processes to decrease the undercut in the contact holes. The contact holes are formed using one mask to decrease a cost of manufacturing the display substrate.

In another exemplary embodiment, the mask for forming the contact holes includes the slits aligned in substantially parallel with each other so that the passivation layer and/or the gate insulating layer is uniformly etched.

Advantageously, the image display quality of the display device is improved.

This invention has been described with reference to the exemplary embodiments. It is evident, however, that many alternative modifications and variations will be apparent to those having skill in the art in light of the foregoing description. Accordingly, the present invention embraces all such alternative modifications and variations as fall within the spirit and scope of the appended claims.

What is claimed is:

1. A display substrate comprising: a substrate; a first insulating layer formed on the substrate; a first electrode formed on the first insulating layer; a second insulating layer formed on the first insulating layer and the first electrode, the second insulating layer including a contact hole which exposes an end portion of the first electrode;

a first conductive pattern electrically connected to the first electrode through the contact hole; and an additional pattern formed between the first insulating layer and the end portion of the first electrode and overlapping the electrode;
a semiconductor layer pattern interposed between the first insulating layer and the first electrode, wherein the additional pattern comprises a material substantially the same as that of the semiconductor layer pattern.

2. The display substrate of claim 1, wherein the first electrode is a drain electrode of a thin film transistor and the first conductive pattern comprises a pixel electrode.

3. The display substrate of claim 1, further comprising: a data pad formed on the first insulating layer to be electrically connected to a second electrode through a data line, the second electrode being spaced apart from the first electrode; and a second conductive pattern electrically connected to the data pad through an auxiliary contact hole through which the data pad and the first insulating layer adjacent to the data pad are partially exposed.

4. The display substrate of claim 3, further comprising an auxiliary pattern formed on the first insulating layer adjacent to the data pad, the auxiliary pattern, being partially exposed through the auxiliary contact hole and having a thickness substantially the same as that of the additional pattern.

5. The display substrate of claim 1, wherein the first electrode comprises: a first metal pattern formed on the first insulating layer; and a second metal pattern formed on the first metal pattern.

6. The display substrate of claim 5, wherein the first metal pattern comprises chromium and the second metal pattern comprises aluminum.

7. The display substrate of claim 1, wherein the first electrode is a data pad, and the first conductive pattern is electrically connected to a data driving circuit.

8. The display substrate of claim 1, further comprising a gate electrode interposed between the substrate and the first insulating layer, wherein the first insulating layer is a gate insulating layer.

9. The display substrate of claim 1, wherein the additional pattern is spaced apart from the semiconductor layer pattern.

10. The display substrate of claim 1, wherein the additional pattern has an etching rate smaller than that of the first insulating layer.

11. The display substrate of claim 10, wherein the additional pattern decreases an undercut under the first electrode.

12. The display substrate of claim 1, wherein the additional pattern comprises: a lower pattern formed on the first insulating layer; and an upper pattern formed between the lower pattern and the end portion of first electrode.

13. The display substrate of claim 12, wherein the lower pattern is partially exposed through the contact hole.

14. The display substrate of claim 1, wherein the additional pattern is partially exposed through the contact hole.

15. The display substrate of claim 2, wherein the drain electrode comprises: a first metal pattern formed on the first insulating layer; and a second metal pattern formed on the first metal pattern.

16. The display substrate of claim 15, wherein the first metal pattern is partially exposed through the contact hole.

17. The display substrate of claim 2, wherein the additional pattern has an etching rate smaller than that of the first insulating layer.

18. The display substrate of claim 4, wherein the auxiliary pattern has an etching rate smaller than that of the first insulating layer.

19. The display substrate of claim 4, further comprising a semiconductor layer pattern interposed between the first insulating layer and the first electrode, wherein the auxiliary pattern comprises a material substantially the same as that of the semiconductor layer pattern.

* * * * *